(12) United States Patent
Mukaiyama et al.

(10) Patent No.: US 11,015,261 B2
(45) Date of Patent: May 25, 2021

(54) SUBSTRATE HOLDER AND PLATING APPARATUS

(71) Applicant: EBARA CORPORATION

(72) Inventors: Yoshitaka Mukaiyama, Tokyo (JP); Toshio Yokoyama, Tokyo (JP); Junitsu Yamakawa, Tokyo (JP); Takuya Tsushima, Tokyo (JP); Tomonori Hirao, Tokyo (JP); Sho Tamura, Tokyo (JP); Hirotaka Ohashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 114 days.

(21) Appl. No.: 16/084,948

(22) PCT Filed: Mar. 7, 2017

(86) PCT No.: PCT/JP2017/008875
§ 371 (c)(1),
(2) Date: Sep. 13, 2018

(87) PCT Pub. No.: WO2017/163849
PCT Pub. Date: Sep. 28, 2017

(65) Prior Publication Data
US 2019/0084777 A1 Mar. 21, 2019

(30) Foreign Application Priority Data
Mar. 22, 2016 (JP) .............................. JP2016-057028

(51) Int. Cl.
*C25D 17/06* (2006.01)
*C25D 17/08* (2006.01)
(Continued)

(52) U.S. Cl.
CPC ............. *C25D 17/06* (2013.01); *B65G 47/52* (2013.01); *B65G 49/02* (2013.01); *C25D 7/123* (2013.01);
(Continued)

(58) Field of Classification Search
CPC .......... B65G 49/02; B65G 47/52; C25D 5/34; C25D 7/123; C25D 17/001; C25D 17/004;
(Continued)

(56) References Cited

U.S. PATENT DOCUMENTS 4,971,676 A * 11/1990 Doue ...................... C23C 14/50
118/503
6,783,299 B2 * 8/2004 Meron ............... H01L 21/68728
269/91

(Continued)

FOREIGN PATENT DOCUMENTS

| JP | 06-077308 A | 3/1994 |
| JP | 11-204459 A | 7/1999 |

(Continued)

OTHER PUBLICATIONS

International Patent Application No. PCT/JP2017/008875; Int'l Search Report; dated Apr. 4, 2017; 2 pages.

*Primary Examiner* — Louis J Rufo
(74) *Attorney, Agent, or Firm* — BakerHostetler

(57) ABSTRACT

To provide a substrate holder and a plating apparatus that can easily position a substrate. A substrate holder includes a substrate holding body for holding a substrate, and a first holding member and a second holding member that interpose and hold the substrate holding body therebetween, and the first holding member includes an opening portion through which the plating target surface of the substrate is exposed, and a power supply member configured to be in contact with a plating target surface of the substrate.

12 Claims, 28 Drawing Sheets

(51) Int. Cl.
*C25D 17/00* (2006.01)
*C25D 7/12* (2006.01)
*H01L 21/67* (2006.01)
*B65G 49/02* (2006.01)
*H01L 21/683* (2006.01)
*H05K 3/18* (2006.01)
*B65G 47/52* (2006.01)
*C25D 5/34* (2006.01)
*H05K 1/02* (2006.01)

(52) U.S. Cl.
CPC ......... *C25D 17/001* (2013.01); *C25D 17/004* (2013.01); *C25D 17/005* (2013.01); *C25D 17/007* (2013.01); *C25D 17/08* (2013.01); *H01L 21/6723* (2013.01); *H01L 21/683* (2013.01); *H05K 3/18* (2013.01); *C25D 5/34* (2013.01); *H05K 1/0271* (2013.01); *H05K 3/188* (2013.01); *H05K 2203/0195* (2013.01); *H05K 2203/1509* (2013.01)

(58) Field of Classification Search
CPC .... C25D 17/005; C25D 17/007; C25D 17/06; C25D 17/08; H01L 21/6723; H01L 21/683; H05K 1/0271; H05K 3/18; H05K 3/188; H05K 2203/0195; H05K 2203/1509
See application file for complete search history.

(56) References Cited

U.S. PATENT DOCUMENTS

| | | | |
|---|---|---|---|
| 2011/0278162 | A1 | 11/2011 | Fredenberg et al. |
| 2012/0043200 | A1 | 2/2012 | Fujikata et al. |
| 2012/0100709 | A1* | 4/2012 | Minami .................. C25D 17/00 438/597 |
| 2013/0154061 | A1 | 6/2013 | Hayashi et al. |
| 2014/0024178 | A1* | 1/2014 | Scanlan ............ H01L 21/68721 438/127 |
| 2015/0068890 | A1* | 3/2015 | Yoshioka ............... C25D 17/06 204/297.01 |
| 2015/0225868 | A1* | 8/2015 | Rauenbusch ........ C25D 17/001 204/297.02 |
| 2015/0294894 | A1* | 10/2015 | Yoshioka ............... C25D 17/06 204/297.01 |

FOREIGN PATENT DOCUMENTS

| | | |
|---|---|---|
| JP | 2007-217767 A | 8/2007 |
| JP | 2012-062570 A | 3/2012 |
| JP | 2013-112880 A | 6/2013 |
| JP | 2015-193935 A | 11/2015 |
| KR | 2011-0088571 A | 8/2011 |

* cited by examiner

SUBSTRATE HOLDER AND PLATING APPARATUS

TECHNICAL FIELD

The present invention relates to a substrate holder and a plating apparatus.

BACKGROUND ART

It has been conventionally performed that wires, bumps (protruding electrodes), and the like are formed on the surface of a substrate such as a semiconductor wafer or a printed circuit board. An electrolytic plating method is known as a method for forming wires, bumps and the like.

A plating apparatus used for the electrolytic plating method includes a substrate holder for holding a circular or polygonal substrate while an end face of the circular or polygonal substrate is sealed and a surface (plating target surface) is exposed. When plating processing is performed on the surface of a substrate in such a plating apparatus, the substrate holder holding the substrate is immersed in plating solution.

When plating processing is performed on the substrate held by the substrate holder, the substrate is required to be electrically connected to a negative voltage side of a power supply in order to apply a negative voltage to the substrate surface. Therefore, the substrate holder is provided with an electrical contact for electrically connecting an external wire extending from the power supply to the substrate. The electrical contact is configured to be in contact with a seed layer (conductive layer) formed on the surface of the substrate, whereby a negative voltage is applied to the substrate. Such a substrate holder is disclosed, for example, in Patent Literature 1.

CITATION LIST

Patent Literature

PTL 1: Japanese Patent Laid-Open No. 2015-193935

SUMMARY OF INVENTION

Technical Problem

A substrate on which various processing such as processing of forming a seed layer and a resist pattern, etc. has been performed is transported into the plating apparatus. A warp may occur on such a substrate subjected to various processing due to various causes. For example, when a seed layer is formed on a substrate by sputtering or the like, stress is applied to the substrate, so that the substrate may warp. Furthermore, when the substrate is a relatively thin printed circuit board or the like, the printed circuit board may not only warp due to film formation performed on the printed circuit board in advance or the like, but also have no sufficient strength to keep the shape of the printed circuit board itself.

In the substrate holder disclosed in Patent Literature 1, the substrate is held by sealing the end face of the substrate and bringing an electrical contact into contact with the surface of the substrate. However, when it is attempted to hold a warped substrate by such a substrate holder, there is a possibility that the seal or electrical contact comes into contact with the substrate to move the substrate, so that the substrate may be displaced from a desired position on a substrate mounting surface.

Furthermore, in a conventional substrate holder, plural guide pins for guiding the substrate are arranged along the circumference of the substrate mounting surface of the substrate holder in order to arrange the substrate at a desired position on the substrate mounting surface of the substrate holder. When the substrate is mounted on the substrate mounting surface, the guide pins come into contact with an end portion of the substrate, whereby the substrate is guided to the desired position on the substrate mounting surface. However, when the substrate warps, the substrate is not horizontally arranged on the substrate mounting surface, so that the substrate may be displaced from the desired position even when the substrate is guided by the guide pins and mounted on the substrate mounting surface.

Furthermore, in the case of a substrate having a relatively low strength such as a printed circuit board, the printed circuit board may be deformed when the guide pin and the printed circuit board are brought into contact with each other, so that the printed circuit board may not be guided to a desired position although no warp occurs on the printed circuit board. In addition, when the substrate holder holds the printed circuit board, the contact of a seal or electrical contact with the printed circuit board may deform the printed circuit board, so that the printed circuit board may be displaced from a desired position on the substrate mounting surface.

The present invention has been made in view of the foregoing problems. An object of the present invention is to provide a substrate holder and a plating apparatus that can easily position a substrate.

Solution to Problem

According to an aspect of the present invention, a substrate holder is provided. The substrate holder includes a substrate holding body for holding a substrate, and a first holding member and a second holding member that interpose and hold the substrate holding body therebetween, wherein the first holding member includes an opening portion through which a plating target surface of the substrate is exposed, and a power supply member configured so as to be in contact with the plating target surface of the substrate.

According to this aspect, when the substrate is held by the substrate holding body, deformation such as a warp of the substrate is corrected, and even when the strength of the substrate is insufficient, the shape of the substrate can be kept. Therefore, positioning between a power supply member and a seal portion in the first holding member and the substrate can be easily performed.

In an aspect of the present invention, the substrate holding body includes a substrate support body for supporting the peripheral edge portion of the substrate, and a fixing member for fixing the substrate supported by the substrate support body to the substrate support body.

According to this aspect, the substrate holding body can fix the substrate while supporting a peripheral edge portion of the substrate.

In an aspect of the present invention, the substrate holding body has a support surface for supporting the peripheral edge portion of the substrate, and an opening through which the plating target surface of the substrate is exposed, and the fixing member has a fixing portion for fixing the peripheral edge portion of the substrate to the support surface, and a moving portion for moving the fixing portion along the support surface.

According to this aspect, the fixing portion is configured to move along the support surface. In other words, the fixing portion is configured to move in the in-plane direction of the supported substrate. Accordingly, the thickness of the substrate holding body in the direction of the substrate thickness can be reduced as compared with a case where the fixing portion moves in the direction of the substrate thickness to fix the substrate to the support surface like a clamp. Eventually, the size in the thickness direction of the substrate holder can be reduced.

In an aspect of the present invention, the first holding member has a guide member for guiding a position of the substrate holding body with respect to the first holding member.

According to this aspect, when the substrate holding body is interposed by the first holding member and the second holding member, the position of the substrate holding body is guided by the guide member. Therefore, positioning of the substrate holding body with respect to the first holding member can be easily performed.

In an aspect of the present invention, the second holding member has a protruding portion on a surface thereof facing the substrate holding body, and the substrate holding body has a hole in which the protruding portion is inserted.

According to this aspect, the positional relationship between the second holding member and the substrate holding body can be easily determined by inserting the protruding portion of the second holding member into the hole of the substrate holding body. By assembling the first holding member and the second holding member under a state where the positional relationship between the second holding member and the substrate holding body has been determined as described above, the position of the substrate holding body with respect to the first holding member, that is, the position of the substrate can be easily determined. This makes it possible to easily bring the power supply member of the first holding member into contact with a desired position on the substrate.

In an aspect of the present invention, the first holding member has an external contact portion that is configured to be electrically connected to an external power supply, and the power supply member is electrically connected to the external contact portion.

According to this aspect, the first holding member has the power supply member and the external contact portion. On the other hand, when the external contact portion is provided to the second holding member, in order to electrically connect the external contact portion of the second holding member and the power supply member of the first holding member, it is necessary to provide the second holding member with a relay contact portion to be electrically connected to the power supply member of the first holding member. Compared with this case, it is unnecessary in this aspect to provide the relay contact portion to the second holding member, so that routing of a wire for connecting the external contact portion and the power supply member can be simplified. Furthermore, according to this aspect, since the second holding member does not have the relay contact portion, if the second holding member can press the substrate holding body against the first holding member, it is unnecessary to position the first holding member and the second holding accurately. That is, since it is sufficient only to perform positioning of the substrate holding body with respect to the power supply member of the first holding member, the positioning of the substrate holding body can be easily performed.

In an aspect of the present invention, the second holding member has an external contact portion configured to be electrically connected to an external power supply, and a relay contact portion configured to be electrically connected to the external contact portion and come into contact with the power supply member of the first holding member.

In an aspect of the present invention, the substrate holding body is configured to be capable of holding a polygonal substrate.

According to this aspect, a polygonal substrate such as a printed circuit board can be held.

In an aspect of the present invention, the opening portion has a polygonal shape corresponding to the polygonal substrate, and is formed in the first holding member so that a corner portion thereof is located at a lower side in a vertical direction when the substrate holder is suspended in the vertical direction.

Processing liquid such as plating solution tends to be accumulated at an edge of the opening portion through which the polygonal substrate is exposed. According to this aspect, when the substrate holder is pulled up from the processing bath, the processing liquid adhering to the substrate or the like moves downwards along the edge of the opening portion of the polygon, and liquid draining of the processing liquid can be promptly performed from the corner portion below the opening portion. Accordingly, when the substrate holder is pulled up from the processing bath and transported to a next step, liquid draining of the plating solution can be quickly performed above the processing bath, so that the substrate holder can be promptly transported while preventing occurrence of a problem such as liquid dripping.

In an aspect of the present invention, the substrate holder further comprises a first seal member for sealing a gap between a plating target surface of the substrate held by the substrate holding body and the first holding member, and a second seal member for sealing a gap between the first holding member and the second holding member, wherein the power supply member is configured to be in contact with the plating target surface of the substrate in a sealed space formed by at least the first seal member and the second seal member.

According to this aspect, since it is possible to prevent the processing liquid such as the plating solution from intruding into the substrate holder, and eventually prevent the processing liquid from coming into contact with the power supply member.

According to an aspect of the present invention, a plating apparatus that performs plating processing using the foregoing substrate holder is provided. This plating apparatus includes a substrate transporting device for transporting the substrate to the substrate holding body, and a substrate holding body mounting/demounting section for mounting/demounting the substrate holding body holding the substrate to/from the first holding member and the second holding member.

According to this aspect, it is possible to transport the substrate to the substrate holding body and also mount/demount the substrate holding body holding the substrate to/from the first holding member and the second holding member.

In an aspect of the present invention, the plating apparatus further comprises a first stocker for stocking the substrate holding body, and a second stocker for stocking the first holding member and the second holding member.

According to this aspect, since the first stocker and the second stocker are separate stockers, taking in and out of the substrate holding body into and from the first stocker and taking in and out of the first holding member and the second holding member into and from the second stocker can be performed simultaneously. Therefore, for example, the first holding member and the second holding member can be moved from the second stocker to the substrate holding body mounting/demounting section at the same time when the substrate holding body is moved from the first stocker to the substrate holding body mounting/demounting section. As a result, the transportation waiting time of each of the substrate holding body, the first holding member and the second holding member can be reduced, and the throughput of the plating apparatus can be enhanced.

In an aspect of the present invention, the substrate holding body mounting/demounting section includes a substrate holding body mounting portion for causing the first holding member and the second holding member to hold the substrate holding body, and a substrate holding body demounting portion for demounting the substrate holding body from the first holding member and the second holding member.

According to this aspect, since the substrate holding body mounting portion and the substrate holding body demounting portion are provided, the first holding member and the second holding member can be caused to hold a substrate holding body in the substrate holding body mounting section at the same time when another substrate holding body is demounted from another first holding member and another second holding member in the substrate holding body demounting portion. As a result, the waiting time for mounting/demounting of the substrate holding body can be reduced, and the throughput of the plating apparatus can be enhanced.

DESCRIPTION OF EMBODIMENTS

First Embodiment

Figure 1:
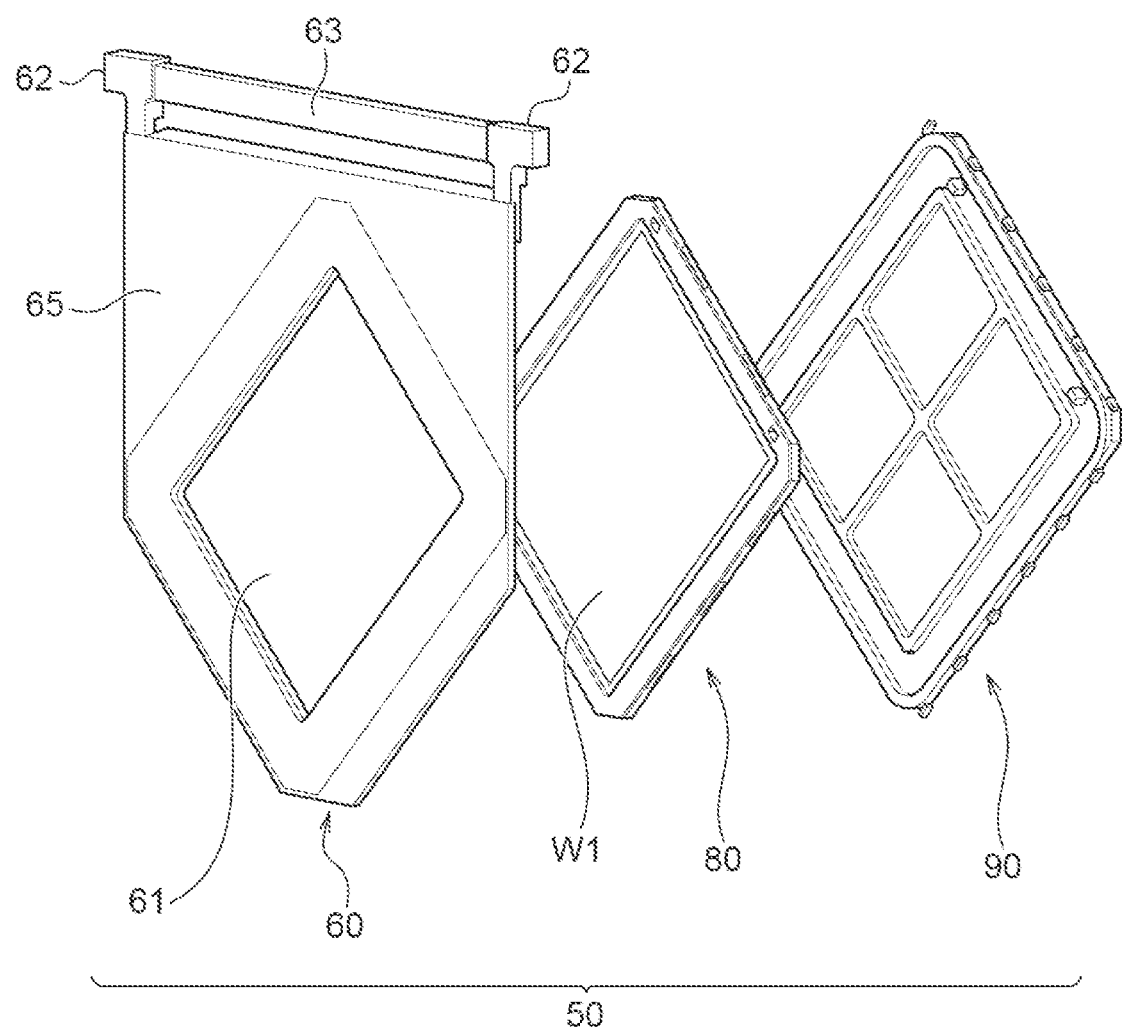
FIG. 1 is a front-side exploded perspective view of a substrate holder according to a first embodiment.
Figure 2:
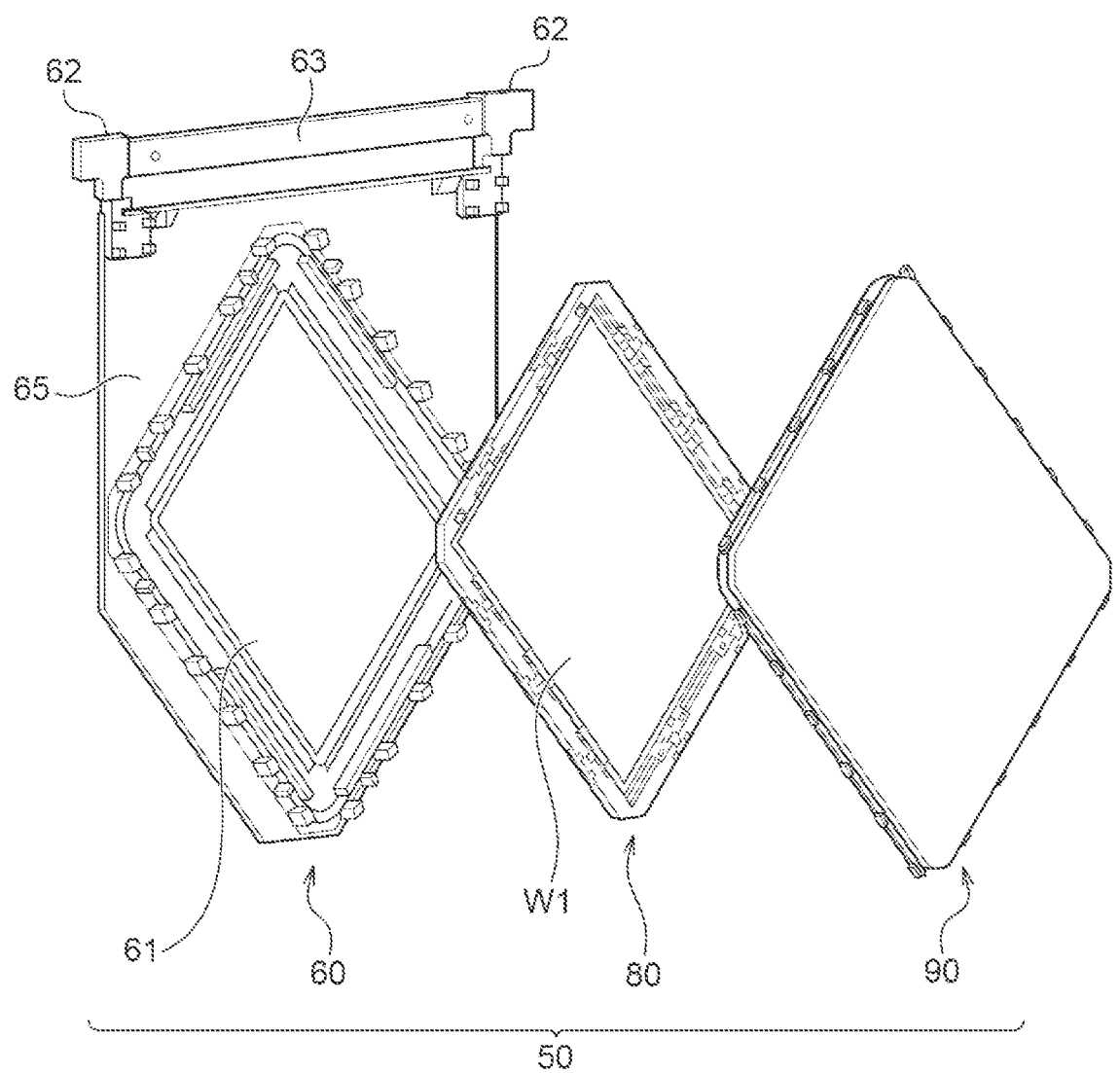
FIG. 2 is a rear-side exploded perspective view of the substrate holder according to the first embodiment.

Embodiments of the present invention will be described below with reference to the drawings. In figures described below, the same or corresponding constituent elements are represented by the same reference signs, and duplicative description thereon will be omitted. FIG. 1 is a front-side exploded perspective view of a substrate holder according to a first embodiment. FIG. 2 is a rear-side exploded perspective view of the substrate holder according to the first embodiment. In the present specification, the front side means a side which a plating target surface of the substrate faces, and the rear side means an opposite side to the front side.

As shown in FIGS. 1 and 2, the substrate holder 50 includes a substrate holding frame 80 (corresponding to an example of a substrate holding body) for holding a substrate W1, and a first holding member 60 and a second holding member 90 that hold the substrate holding frame 80 while interposing the substrate holding frame 80 therebetween. The first holding member 60 includes a base portion 65 having an opening portion 61 for exposing the plating target surface of the substrate W1, and a pair of substantially L-shaped suspension portions 62 for suspending a substrate holder 50 in processing baths such as a plating bath of a plating apparatus described later. The suspension portions 62 are connected to an upper end of the base portion 65. The substrate W1 can be accommodated in each bath by supporting the suspension portions 62 of the first holding member 60 at an edge of an opening portion of the bath. The first holding member 60 has an arm portion 63 for connecting the suspension portions 62 between the pair of suspension portions 62. The suspension portions 62 or the arm portion 63 is gripped by a substrate holder transporting device described later, whereby the substrate holder 50 is transported in the plating apparatus.

The plating target surface of the substrate W1 held by the substrate holding frame 80 faces the side of the first holding member 60. The second holding member 90 faces a surface on the opposite side to the plating target surface of the substrate W1 held by the substrate holding frame 80. In an example of the present embodiment, the substrate W1 is a polygonal substrate such as a printed board (a square substrate in figures). Therefore, the opening portion 61 has a polygonal shape corresponding to the shape of the polygonal substrate. In the present embodiment, the substrate holding frame 80 is configured to hold the polygonal substrate. However, the substrate holding frame 80 is not limited to this configuration, and may be configured to hold a circular substrate such as a semiconductor wafer. In this case, the shapes of the opening portion 61 of the first holding member, the substrate holding frame 80, and the second holding member 90 can be shaped so as to be suitable for holding the circular substrate.

Figure 3:
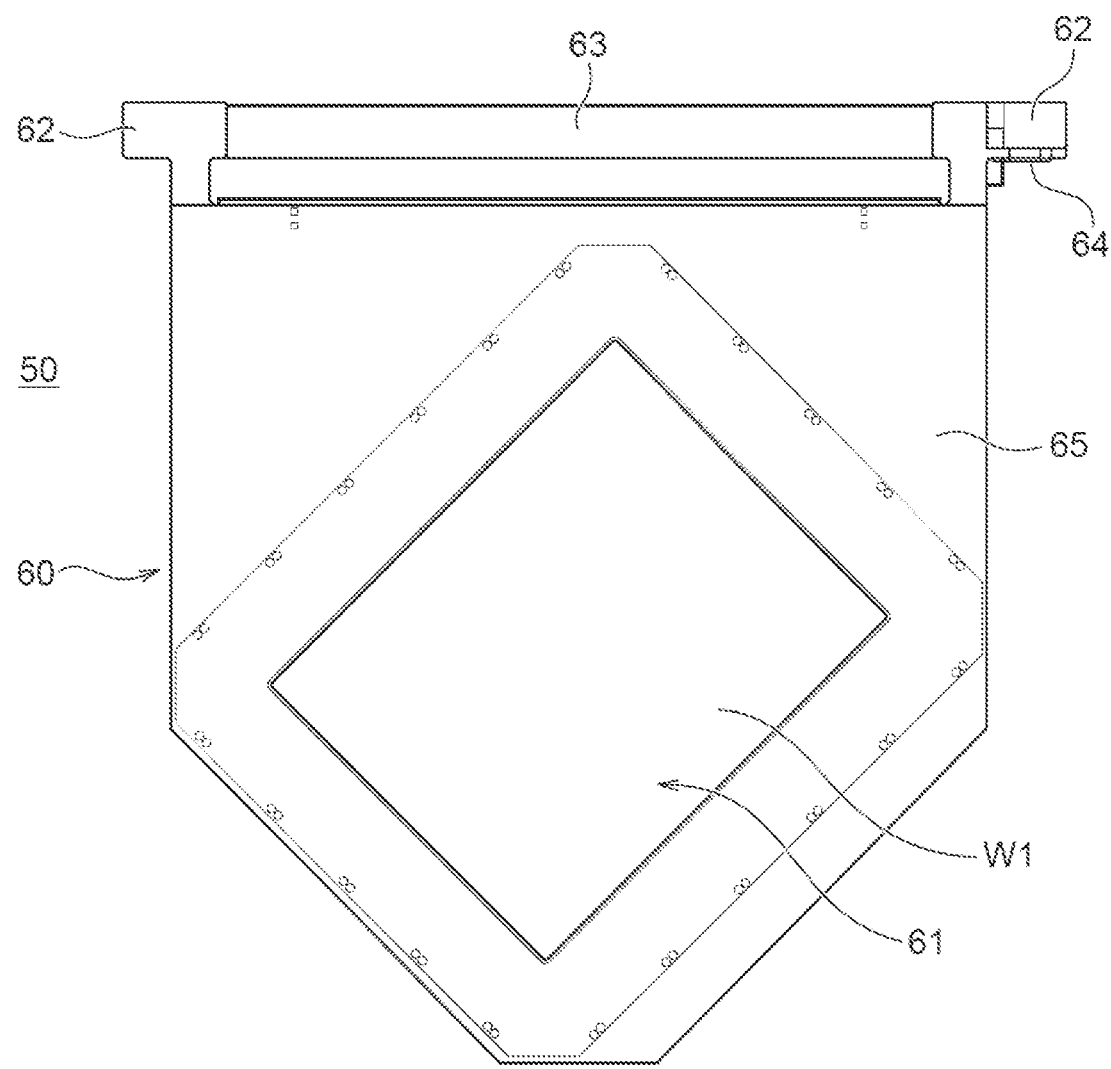
FIG. 3 is a front view of the substrate holder.
Figure 4:
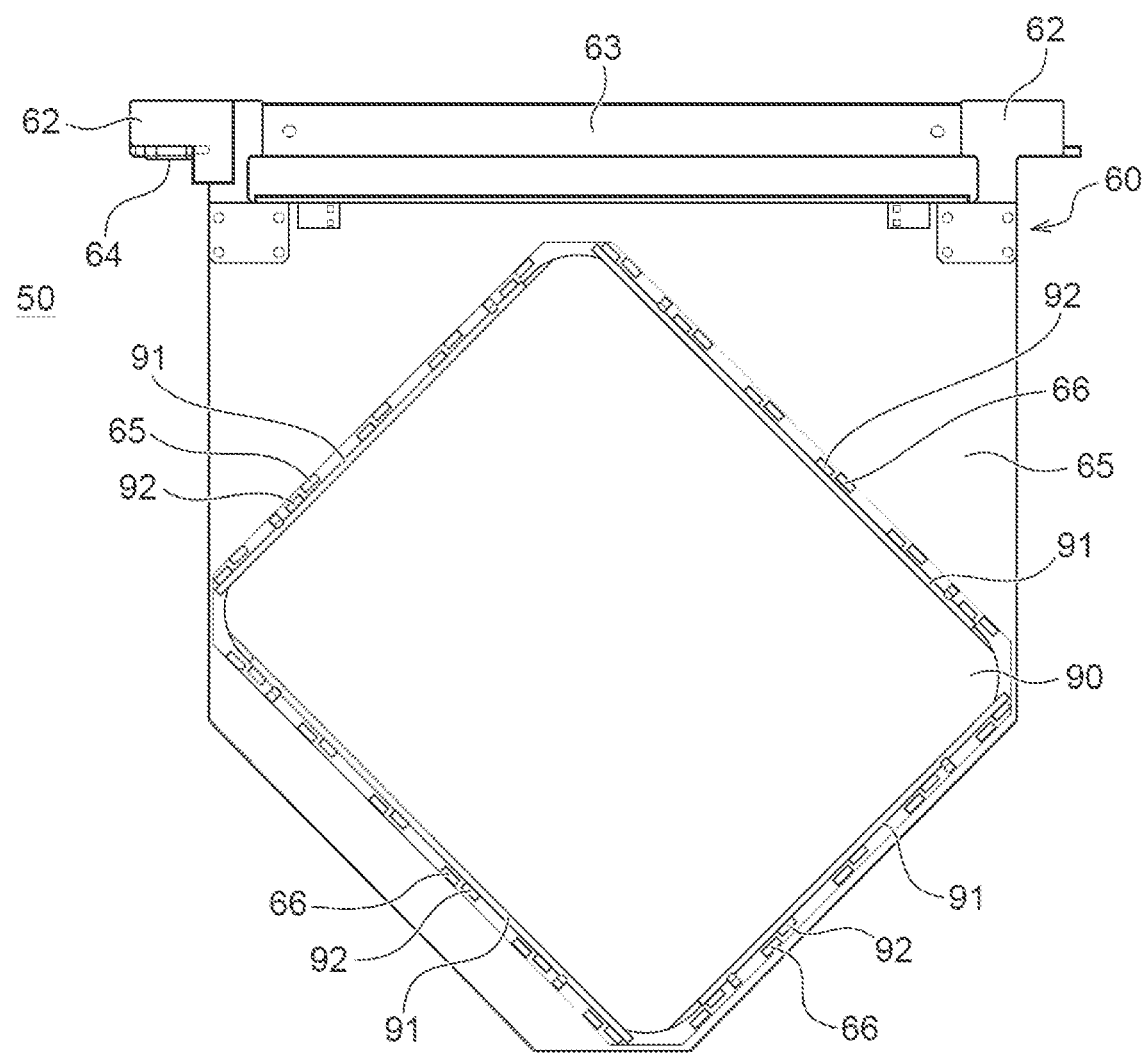
FIG. 4 is a rear view of the substrate holder.

FIG. 3 is a front view of the substrate holder 50. FIG. 4 is a rear view of the substrate holder 50. As shown in FIG. 3, the front side of the base portion 65 of the first holding member 60 is formed to be substantially flat. As a result, when the substrate holder 50 is taken out from a processing bath, liquid draining of processing liquid can be efficiently performed. In order to more efficiently perform liquid draining, it is preferable that the front surface of the base portion 65 is formed of a fluororesin or the front surface of the base member 65 is covered with fluororesin. Furthermore, the front side of the base portion 65 is formed to be substantially flat, whereby it is possible to reduce the amount of processing liquid drooping from the upper surface of the substrate W1 during transportation of the substrate holder 50. Therefore, a risk of contamination of the surface of the substrate W1 during transportation can be reduced. Furthermore, it is possible to reduce influence on electric field by irregularities of the surface of the base portion 65 during plating processing on the substrate W1.

As shown in FIG. 3, the opening portion 61 is formed in the substrate holder 50 so that a corner portion of the opening 61 is located at a vertically lower side when the substrate holder 50 is suspended vertically. In other words, the substrate holding frame 80 shown in FIGS. 1 and 2 is held by the first holding member 60 and the second holding member 90 so that a corner portion of the polygonal substrate W1 is located at a vertically lower side when the substrate holder 50 is suspended vertically. As a result, when the substrate holder 50 is pulled up from the processing bath, the processing liquid adhering to the substrate W1 or the like moves downward along the edge of the opening portion 61, and liquid draining of the processing liquid from the corner portion on the lower side of the opening portion 61 can be quickly performed. Therefore, when the substrate holder 50 is pulled up from the processing bath and transported to a next step, liquid draining of the plating solution can be quickly performed above the processing bath, so that the substrate can be promptly transported while preventing occurrence of a problem such as liquid dripping.

As shown in FIGS. 3 and 4, one of the pair of suspension portions 62 is provided with an external contact portion 64 which is configured to be electrically connected to an external power supply. The external contact portion 64 is electrically connected to a power supply member described later which is in contact with the plating target surface of the substrate W1. As a result, current can be applied from the external power supply to the plating target surface of the substrate W1 via the external contact portion 64.

As shown in FIG. 4, the first holding member 60 has plural substantially L-shaped clampers 66 (see FIG. 5 described later) arranged along the circumference of the second holding member 90. The second holding member 90 includes sliders 91 slidable along a surface thereof facing the clampers 66, and plural protrusion portions 92 fixed to the sliders 91. By moving the sliders 91 in a state where the second holding member 90 presses the substrate holding frame 80 (see FIGS. 1 and 2) against the first holding member 60, each of the sliders 91 intrudes into each clamper 66. As a result, the second holding member 90 is held by the clampers 66, and the substrate holding frame 80 is interposed and fixed between the first holding member 60 and the second holding member 90.

Figure 5:
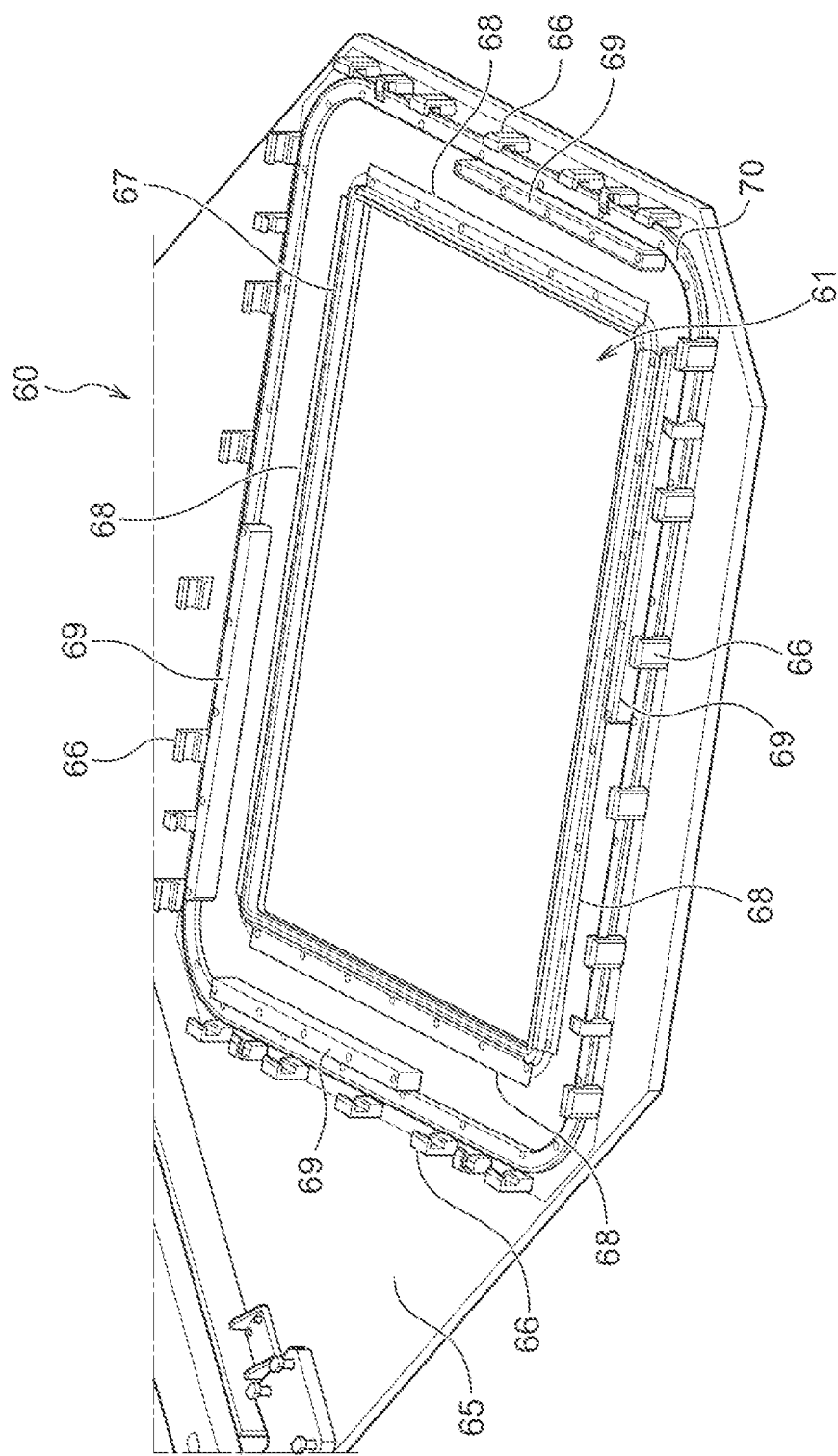
FIG. 5 is a rear-side enlarged perspective view of a base portion of a first holding member.

Next, the detailed structures of the first holding member 60, the substrate holding frame 80, and the second holding member 90 will be described. FIG. 5 is an enlarged perspective view of the rear side of the base portion 65 of the first holding member 60. As shown in FIG. 5, a first seal member 67, plural power supply members 68, plural guide members 69, and a second seal member 70 are provided on the rear side of the base portion 65 of the first holding member 60.

The first seal member 67 is configured so as to extend along the circumference of the opening portion 61 and to seal the gap between the plating target surface of the substrate W1 held by the substrate holding frame 80 and the first holding member 60. Specifically, when the substrate holding frame 80 holding the substrate W1 is pressed against the first holding member 60 by the second holding member 90, the first seal member 67 comes into contact with the peripheral portion of the substrate W1, and seal the gap between the plating target surface of the substrate W1 and the first holding member 60. In the present embodiment, the first seal member 67 is provided to the first holding member 60. However, the present invention is not limited to this configuration, and the first seal member 67 may be provided to the substrate holding frame 80 or the second holding member 90.

Figure 24:
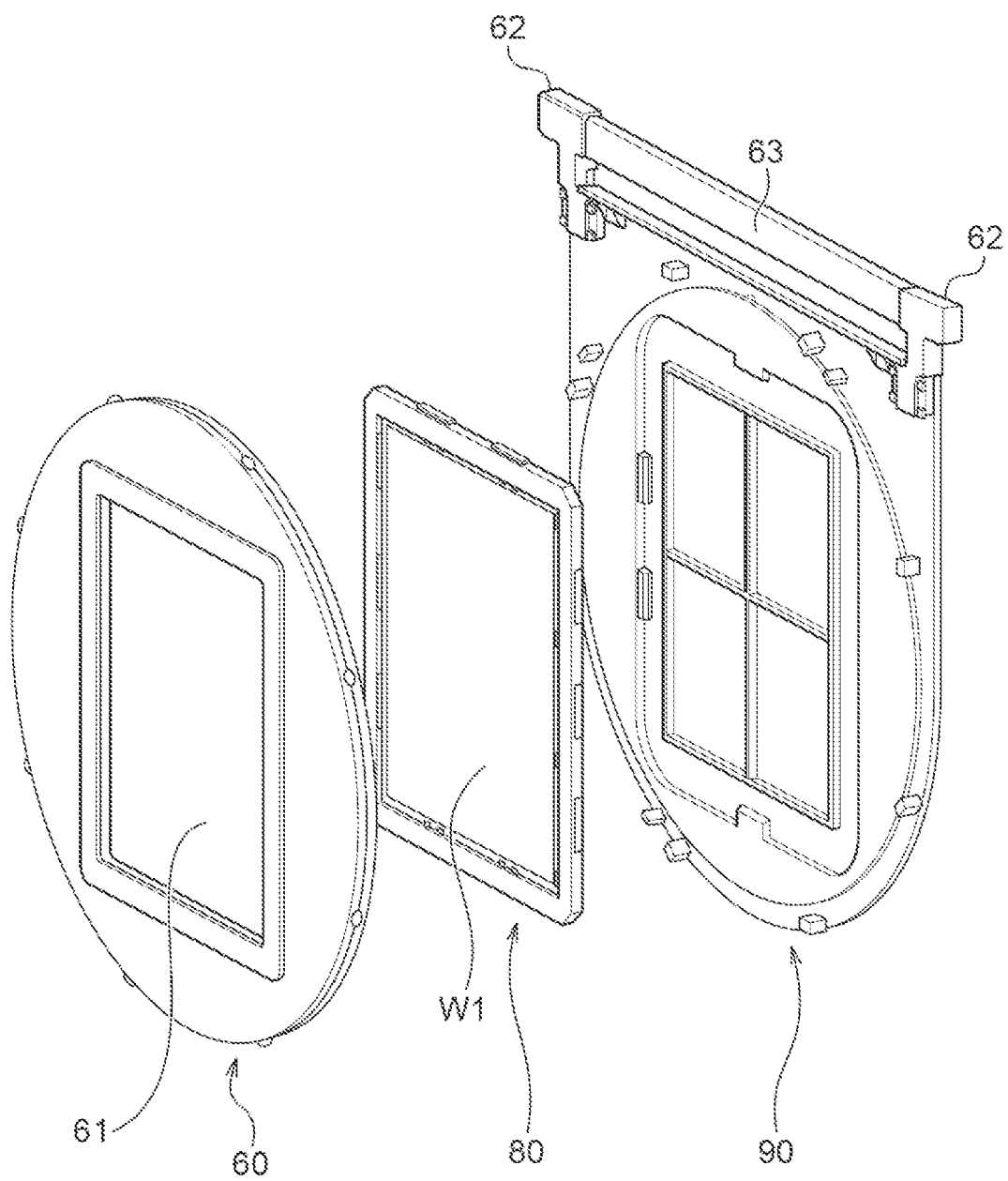
FIG. 24 is an exploded perspective view showing a substrate holder according to a fourth embodiment.
Figure 25:
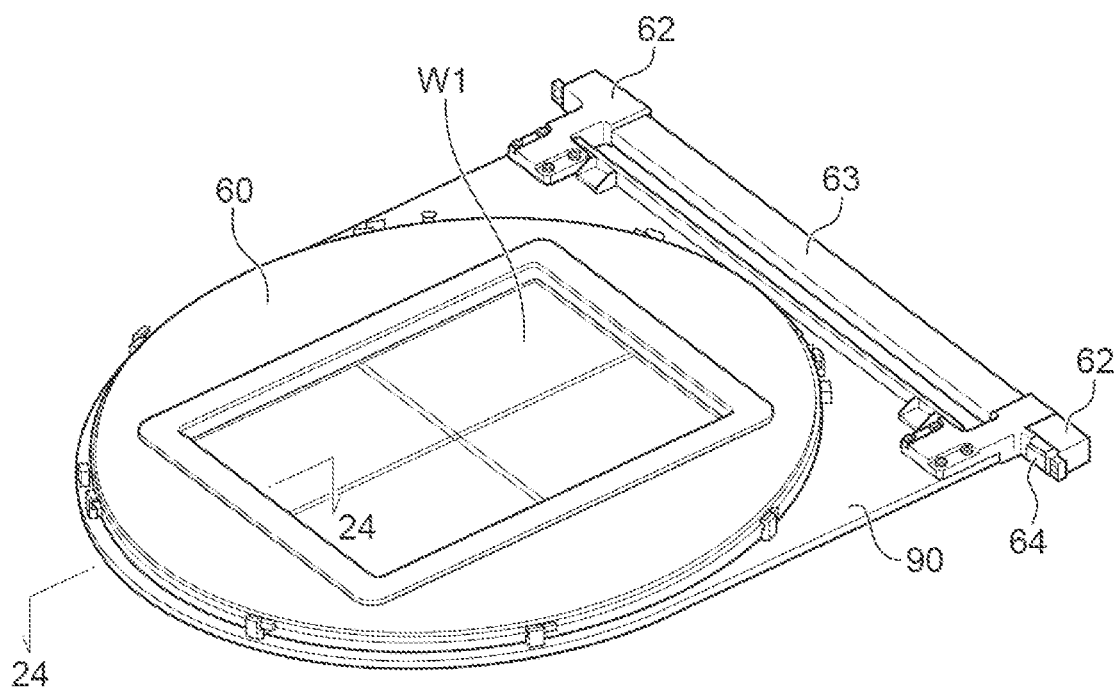
FIG. 25 is a perspective view showing the substrate holder according to the fourth embodiment.
Figure 26:
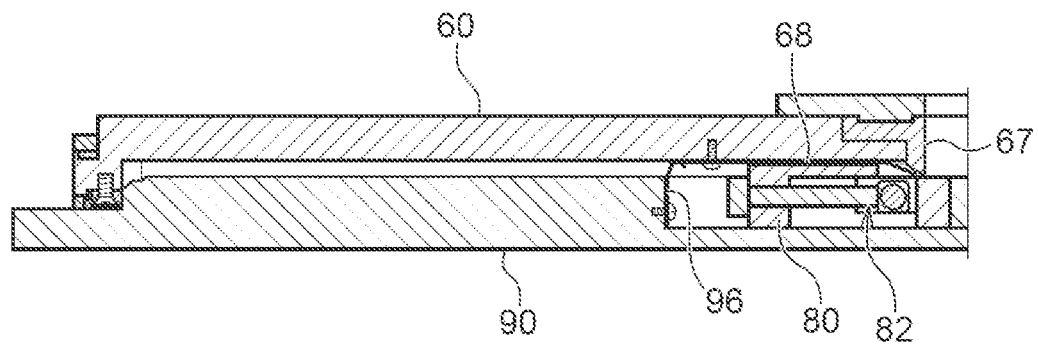
FIG. 26 is a perspective view of the substrate in an arrow view 24-24 shown in FIG. 25.

The power supply member 68 is positioned on the outer peripheral side of the first seal member 67 and configured to be in contact with the plating target surface of the substrate W1. As shown in FIG. 5, the power supply member 68 is arranged along the side of the polygonal opening portion 61 and is in contact with the substrate W1 along the side of the polygonal substrate W1. The power supply member 68 is electrically connected to the external contact portion 64 shown in FIGS. 3 and 4, and configured to make current to flow into a conductive layer formed on the plating target surface of the substrate W1. As described above, in the present embodiment, the first holding member 60 has the power supply member 68 and the external contact portion 64. On the other hand, as shown in FIGS. 24 to 26 described later, when the external contact portion 64 is provided to the second holding member 90, in order to electrically connect the external contact portion 64 of the second holding member 90 and the power supply member 68 of the first holding member 60, it is necessary to provide the second holding member 90 with a relay contact portion to be electrically connected to the power supply member 68 of the first holding member 60. As compared with this case, since it is unnecessary in the present embodiment to provide a relay contact portion in the second holding member 90, routing of a wire for connecting the external contact portion 64 and the power supply member 68 can be simplified. Furthermore, since the second holding member 90 does not have any relay contact portion in the present embodiment, it would be unnecessary to position the first holding member 60 and the second holding member 90 accurately if the second holding member 90 is capable of pressing the substrate holding frame 80 against the first holding member 60. That is, since it is sufficient only to position the substrate holding frame 80 with respect to the power supply member 68 of the first holding member 60, the substrate holding frame 80 can be easily positioned.

The guide member 69 is a member arranged between the power supply member 68 and the second seal member 70, and has a function of guiding the position of the substrate holding frame 80 with respect to the first holding member 60. In an example of FIG. 5, the guide member 69 has a substantially plate shape, and four guide members 69 are provided to the first holding member 60 so that the inner peripheral surfaces of the four guide members 69 profile the outer shape of the substrate holding frame 80. When the second holding member 90 presses the substrate holding frame 80 against the first holding member 60, the substrate holding frame 80 can be easily positioned at a desired position of the first holding member 60 by locating the substrate holding frame 80 inside the four guide members 69. The number and shape of the guide members 69 are arbitrary, and it is sufficient for the guide members to guide the position of the substrate holding frame 80 with respect to the first holding member 60. For example, the first holding member 60 may have one guide member 69 which is shaped so as to profile the outer shape of the substrate holding frame 80. In addition, three guide members 69 may be provided to the holding member 60 so as to profile the outer shape of the substrate holding frame 80.

The second seal member 70 is positioned on the outer peripheral side of the guide members 69 and extends over the periphery of the opening 61. The second seal member 70 is configured to seal the gap between the first holding member 60 and the second holding member 90. Specifically, when the second holding member 90 presses the substrate holding frame 80 against the first holding member 60, the second seal member 70 comes into contact with the outer peripheral portion of the second holding member 90 to seal the gap between the first holding member 60 and the second holding member 90. In the present embodiment, the second seal member 70 is provided to the first holding member 60. However, the present embodiment is not limited to this configuration, and the second seal member 70 may be provided to the substrate holding frame 80 or the second holding member 90. When the first holding member 60 and the second holding member 90 interpose and fix the substrate holding frame 80 therebetween, the first seal member 67 seals the gap between the substrate W1 and the first holding member 60, and the second seal member 70 seals the gap between the first holding member 60 and the second holding member 90. At this time, a sealed space is formed by the substrate W1, the first seal member 67, the second seal member 70, the first holding member 60, and the second holding member 90, and the power supply member 68 is arranged in the sealed space. As a result, the processing liquid such as plating solution does not intrude into the sealed space, so that the processing liquid can be prevented from coming into contact with the power supply member 68.

Figure 6:
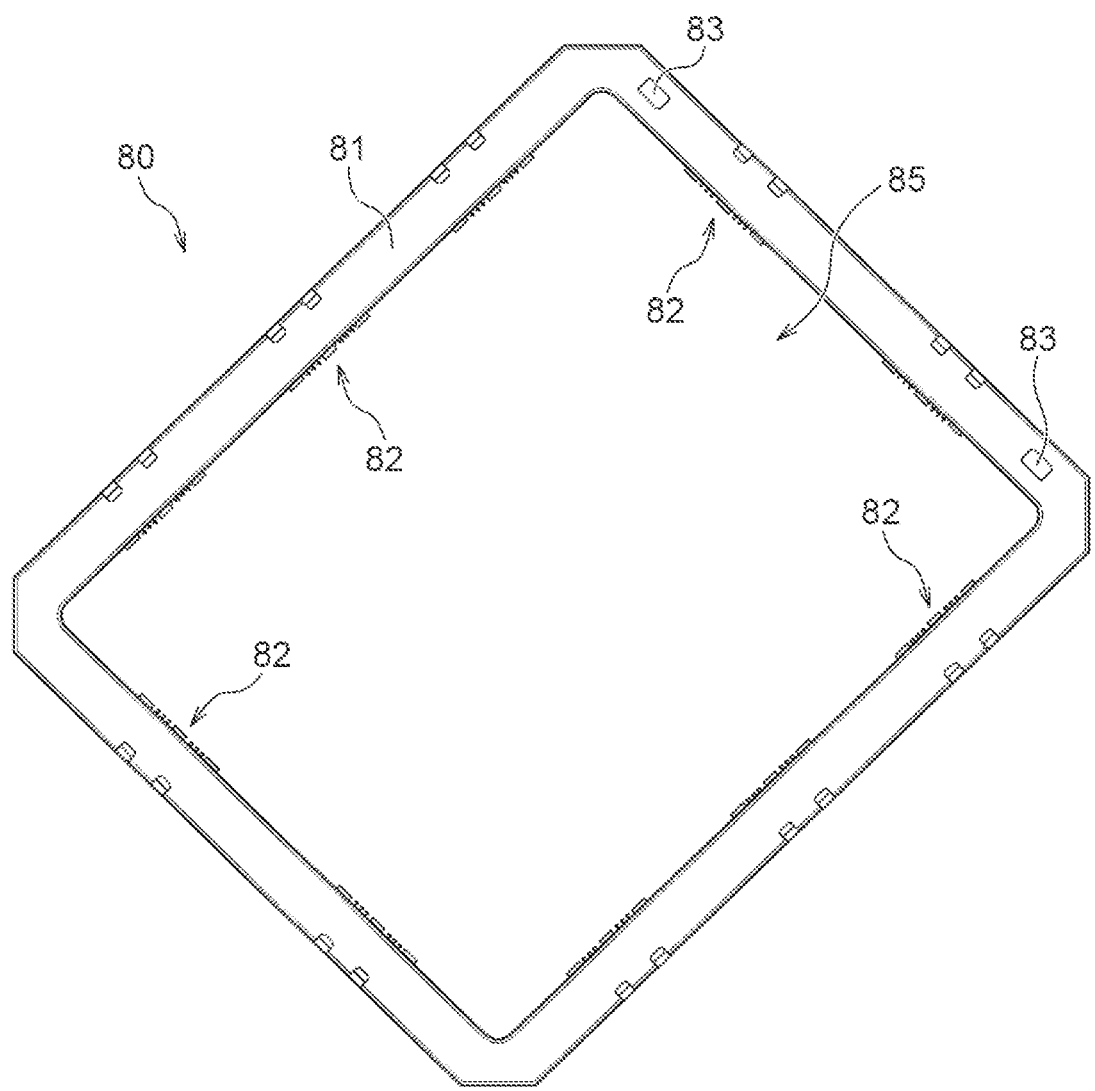
FIG. 6 is a front view of a substrate holding frame.
Figure 7:
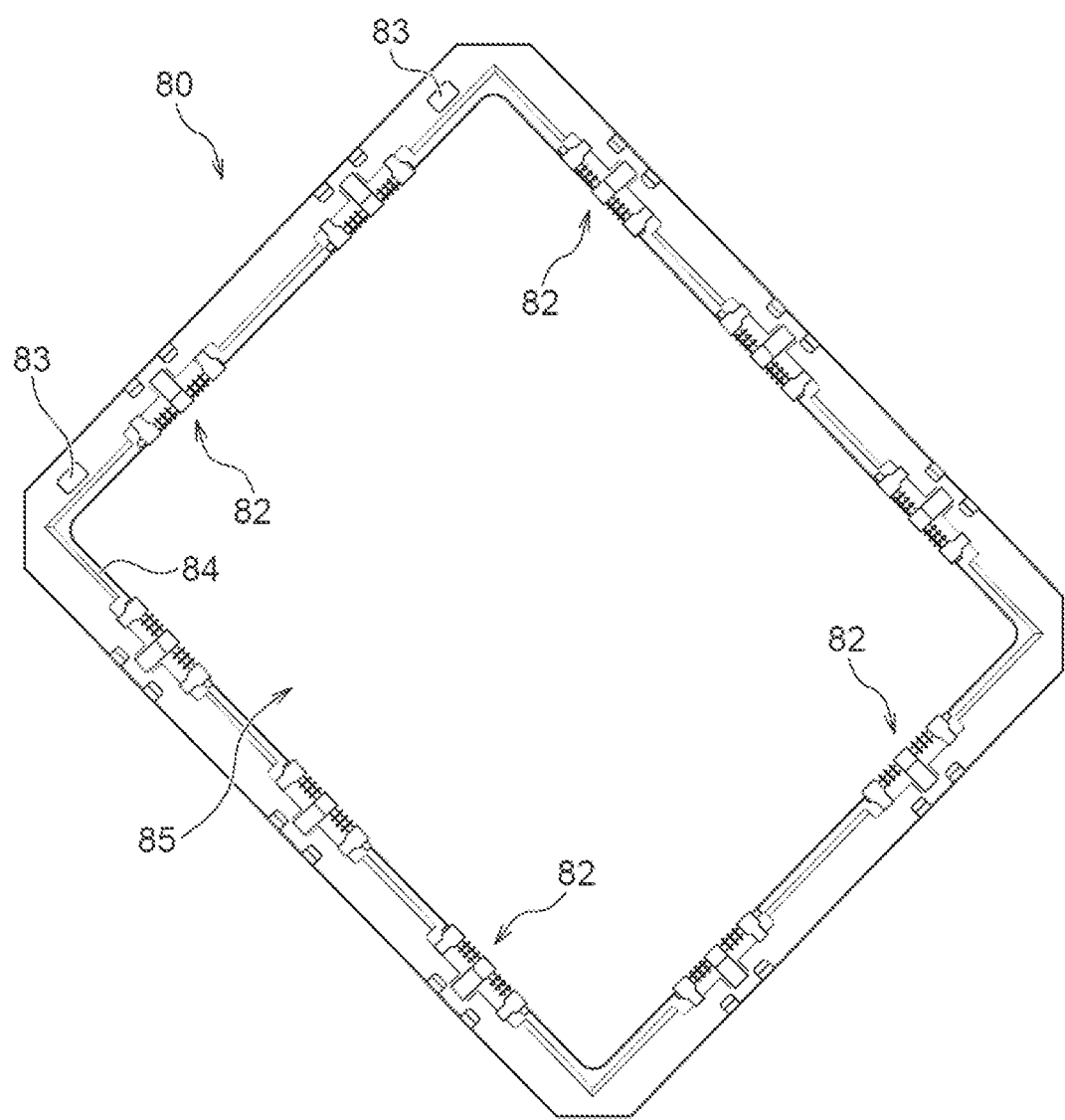
FIG. 7 is a rear view of the substrate holding frame.
Figure 8:
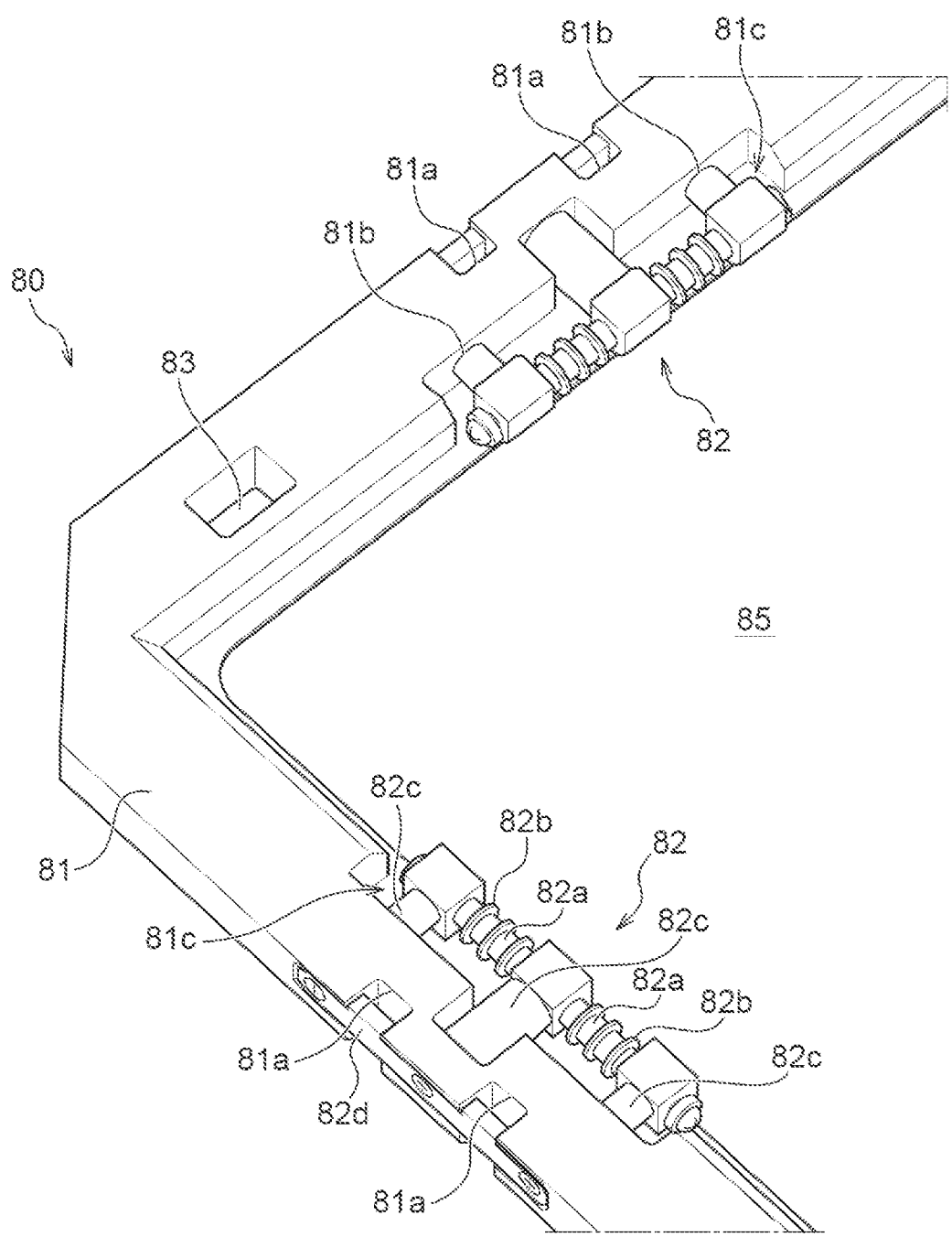
FIG. 8 is a partially enlarged perspective view of the substrate holding frame.

FIG. 6 is a front view of the substrate holding frame 80. FIG. 7 is a rear view of the substrate holding frame 80. FIG. 8 is a partially enlarged perspective view of the substrate holding frame 80. As shown in FIGS. 6 to 8, the substrate holding frame 80 includes a substrate supporting body 81 for supporting at least a peripheral edge portion of the substrate W1, and a fixing member 82 for fixing the substrate W1 supported by the substrate supporting body 81 to the substrate supporting body 81. The substrate supporting body 81 has as frame-like shape as a whole, and includes a support surface 84 for supporting the peripheral edge portion of the substrate W1, an opening 85 for exposing the plating target surface of the substrate W1, and holes 83 through which protruding portions described later of the second holding member 90 are inserted.

As shown in FIGS. 7 and 8, plural fixing members 82 are provided along the circumference of the opening 85 of the substrate supporting body 81. As shown in FIG. 8, the fixing member 82 includes rod members 82a for fixing the peripheral edge portion of the substrate W1 to the support surface 84, ring-shaped elastic bodies 82b wound around the outer periphery of the rod members 82a, slide members 82c (corresponding to an example of a moving member) for moving the rod members 82a and the elastic bodies 82b along the support surface 84, and a connecting member 82d connecting the end portions of the plural slide members 82c. The slide member 82c is configured to be slidable in a through-hole 81b formed in the substrate supporting body 81. The fixing member 82 is urged to the opening 85 by a biasing member such as a spring (not shown). Therefore, the fixing member 82 is located on the center side of the opening 85 under a normal state. When the substrate W1 is held by the substrate holding frame 80, a releasing mechanism such as a pawl is inserted between a cutout portion 81a formed on the substrate supporting body 81 and a connecting member 82d, and is pulled to the outside of the substrate supporting body 81. As a result, the rod members 82a and the elastic bodies 82b of the fixing member 82 are accommodated in a cutout area 81c formed on the inner peripheral side of the substrate supporting body 81, so that the substrate W1 can be mounted on the support surface 84.

In the present embodiment, since the rod members 82a and the elastic bodies 82b of the fixing member 82 move along the support surface 84, the thickness of the substrate holding frame 80 in the thickness direction of the substrate W1 can be reduced. In addition, the size in the thickness direction of the substrate holder 50 can be reduced.

Figure 9:
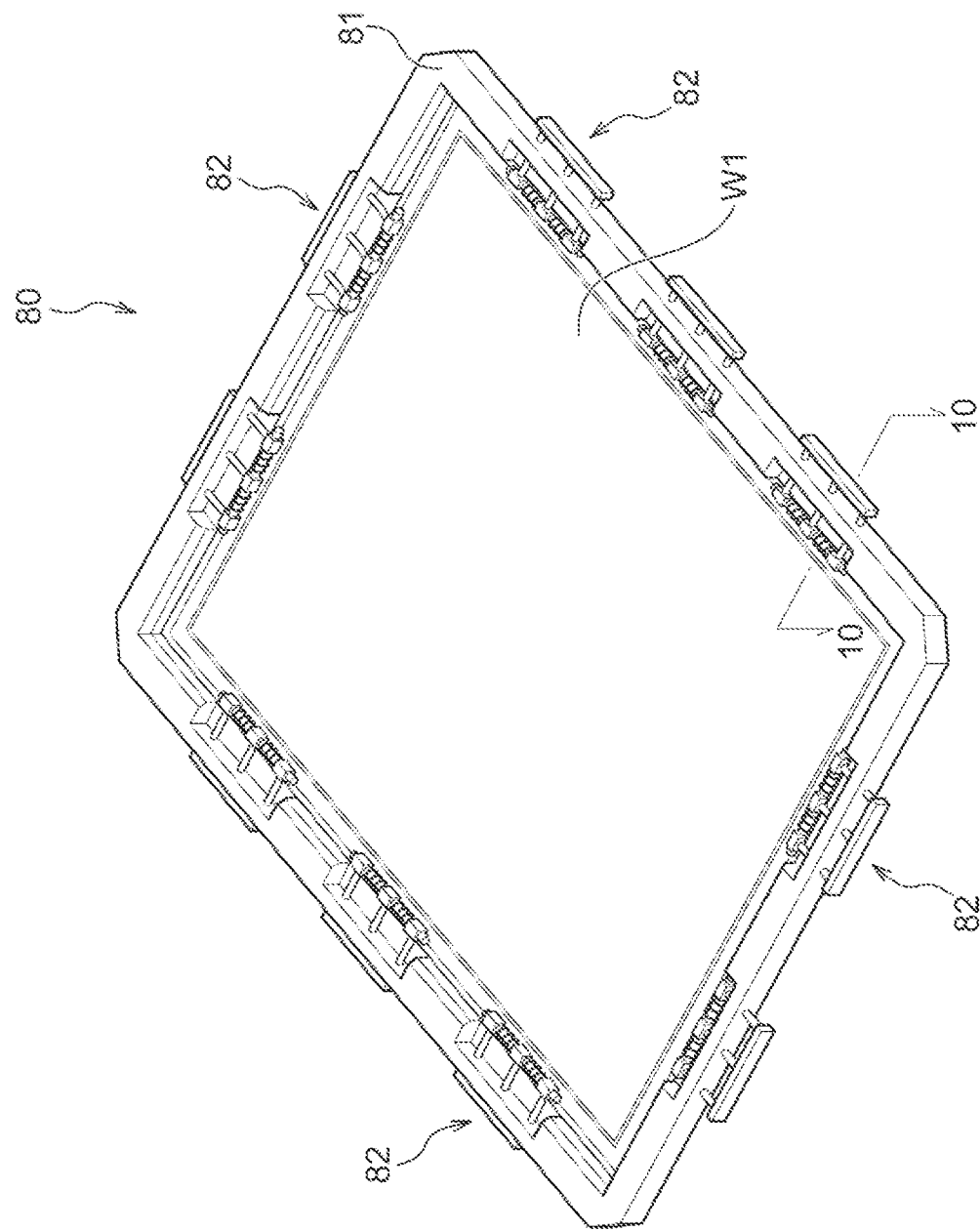
FIG. 9 is a perspective view showing the substrate holding frame under a state in which a substrate is held.
Figure 10:
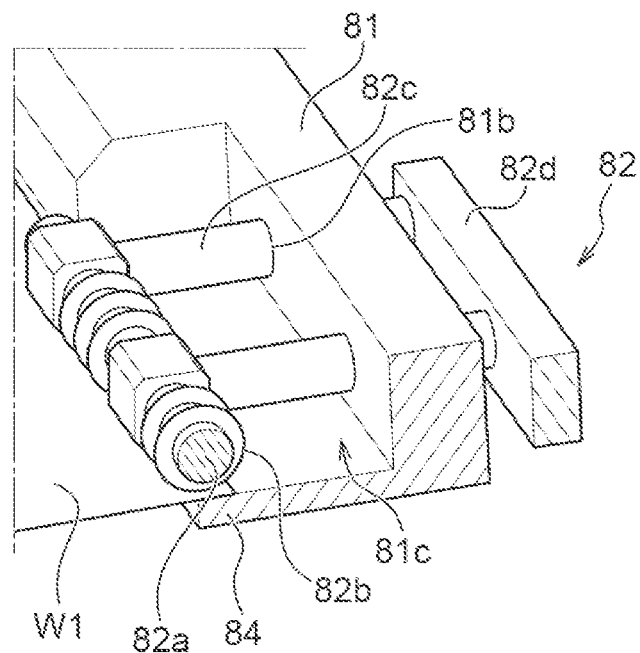
FIG. 10 is a cross-sectional view of the substrate holding frame in an arrow view 10-10 shown in FIG. 9 under a state in which the substrate is held.
Figure 11:
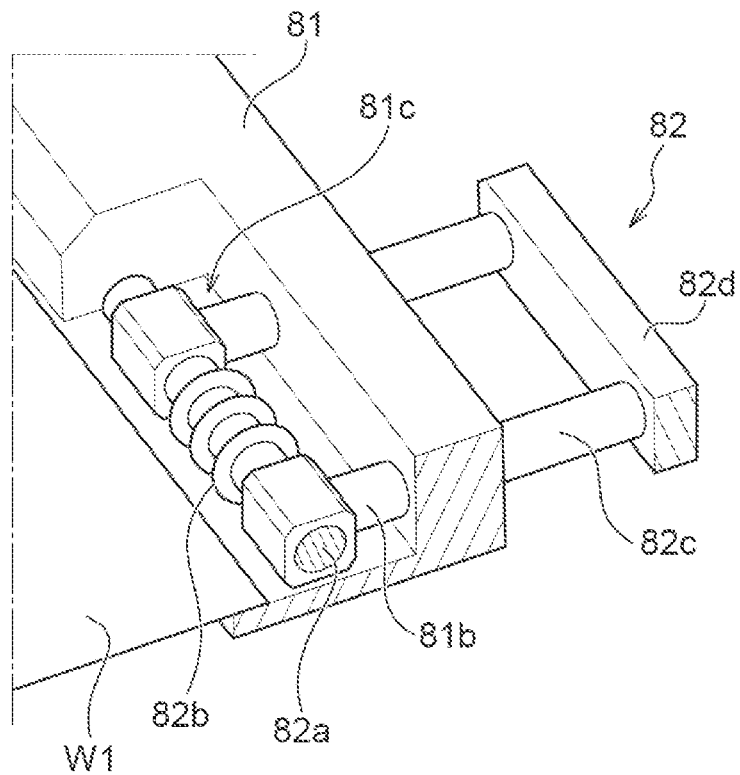
FIG. 11 is a cross-sectional view of the substrate holding frame in an arrow view 10-10 shown in FIG. 9 under a state in which the holding of the substrate is released.

FIG. 9 is a perspective view showing the substrate holding frame 80 under a state in which the substrate W1 is held. FIGS. 10 and 11 are cross-sectional views of the substrate holding frame 80 in an arrow view 10-10 shown in FIG. 9, FIG. 10 shows a state in which the substrate W1 is held, and FIG. 11 shows a state where holding of the substrate W1 is released. In FIGS. 9 to 11, the holes 83 and the cutout portions 81a shown in FIGS. 7 and 8 are omitted from the illustration.

As shown in FIG. 9, the peripheral edge portion of the substrate W1 is fixed to the substrate supporting body 81 by the fixing members 82. As shown in FIG. 10, when the substrate W1 is held by the substrate holding frame 80, the substrate W1 is pressed against and fixed to the support surface 84 by the elastic bodies 82b provided on the outer peripheries of the rod members 82a. That is, the rod members 82a and the elastic bodies 82b function as a fixing portion for fixing the peripheral edge portion of the substrate W1 to the support surface 84. However, this fixing portion is not limited to the case where the fixing portion is constituted by the rod members 82a and the elastic bodies 82b of the present embodiment, but the fixing portion may have an arbitrary configuration such as a configuration of holding by a cam mechanism, for example. When the holding of the substrate W1 is released, as shown in FIG. 11, the rod members 82a and the elastic bodies 82b are accommodated in the cutout area 81c of the substrate supporting body 81. In the present embodiment, the fixing member 82 is configured to be in contact with the end portion of the substrate W1, for example, within a range of about 5 mm from the end portion of the substrate W1. An appropriate value can be adopted as a dimension for holding the substrate according to requirements.

Figure 12:
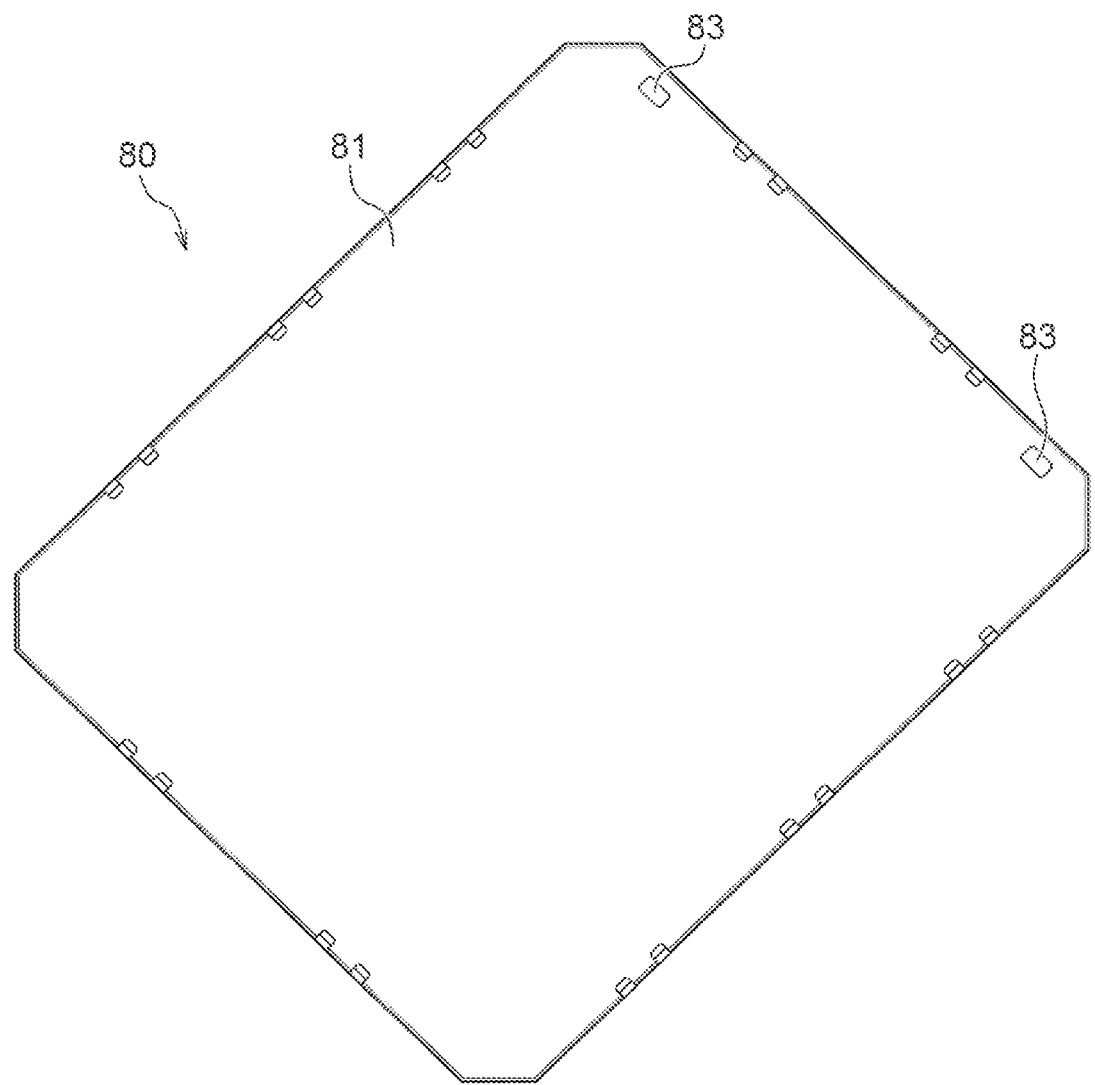
FIG. 12 is a rear view of a substrate holding frame of another form.
Figure 13:
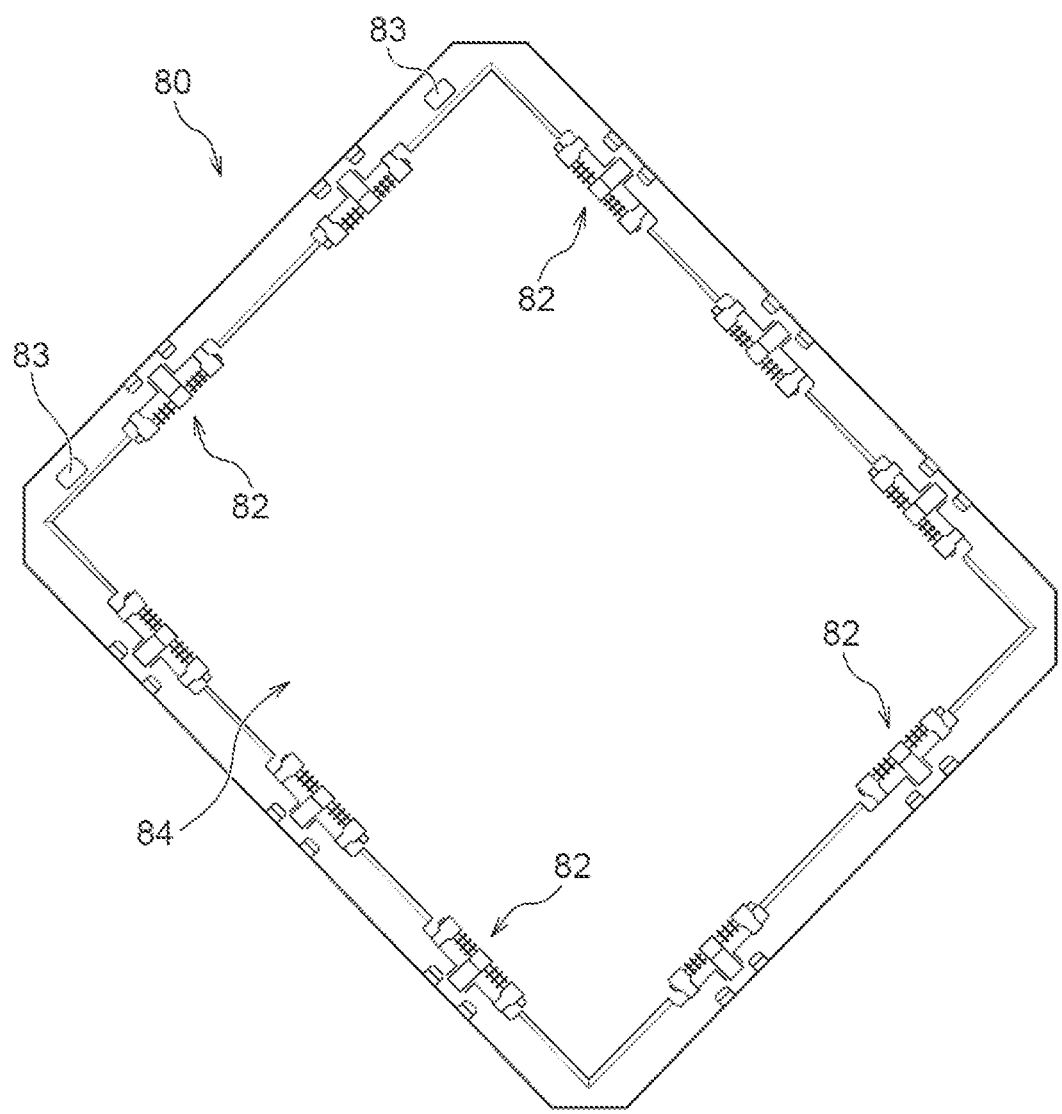
FIG. 13 is a front view of a substrate holding frame of another form.

It has been described that the substrate holding frame 80 shown in FIGS. 6 to 11 has the opening 85 through which the plating target surface of the substrate W1 is exposed. However, the structure of the substrate holding frame 80 is not limited to the above structure. FIG. 12 is a rear view of a substrate holding frame 80 of another form. FIG. 13 is a front view of the substrate holding frame 80 in the other form. As shown in FIGS. 12 and 13, the substrate holding frame 80 does not have the opening 85 shown in FIGS. 6 to 11, and the support surface 84 exists over the entire surface of the substrate supporting body 81. In this case, the support surface 84 is configured to support the whole surface on the opposite side to the plating target surface of the substrate W1, and the fixing member 82 is in contact with the peripheral edge portion on the side of the plating target surface of the substrate W1 to fix the substrate W1 to the support surface 84. In the substrate holding frame 80 shown in FIGS. 12 and 13, a portion of the fixing member 82 which is in contact with the plating target surface of the substrate W 1 is formed of a conductive member, and is configured so as to electrically connect the conductive member to the external power supply. As a result, the fixing member 82 can make current to flow in the conductive layer formed on the plating target surface of the substrate W1, and thus it is unnecessary to provide the power supply member 68 to the first holding member 60.

Figure 14:
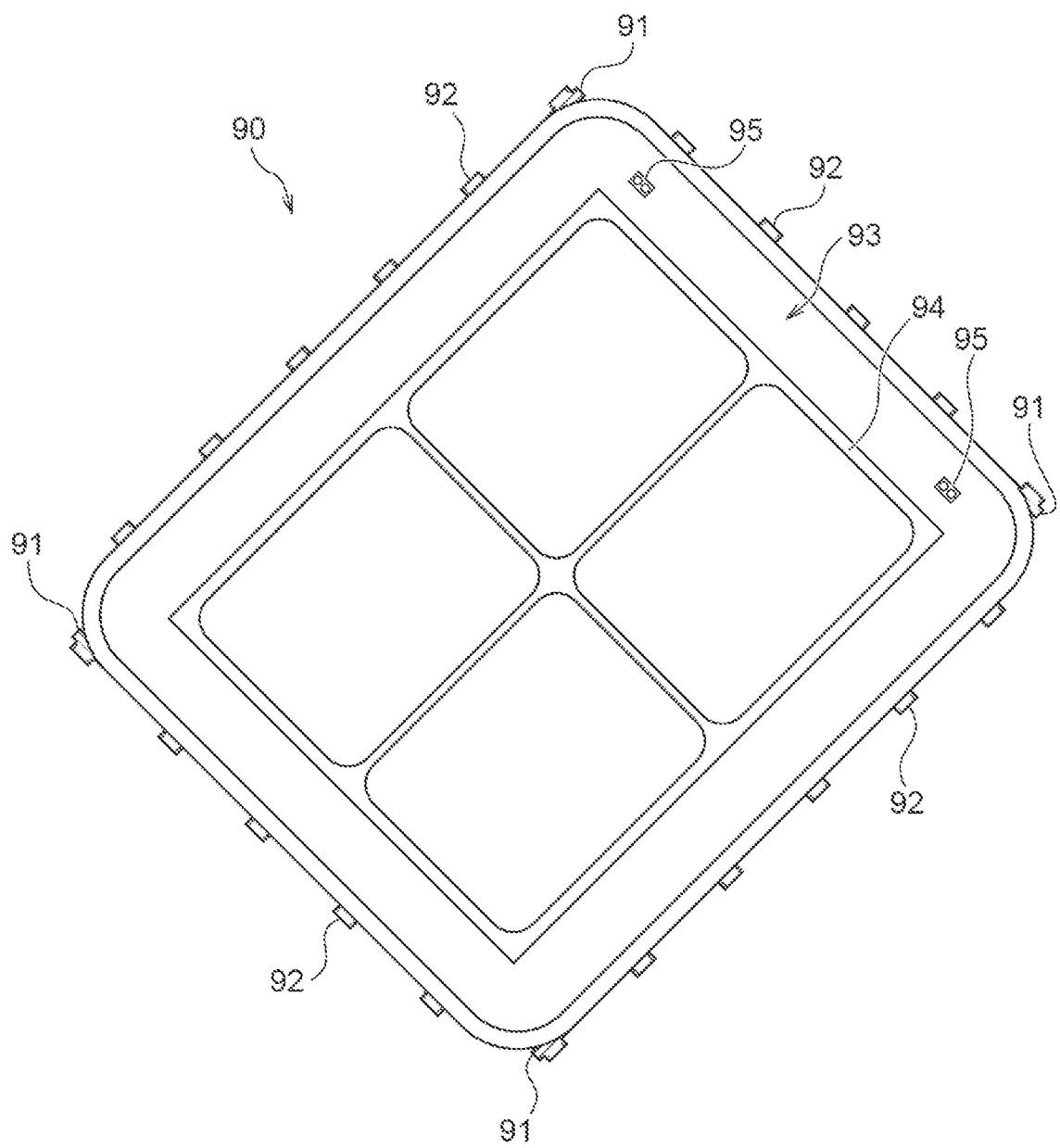
FIG. 14 is a front view of a second holding member.
Figure 15:
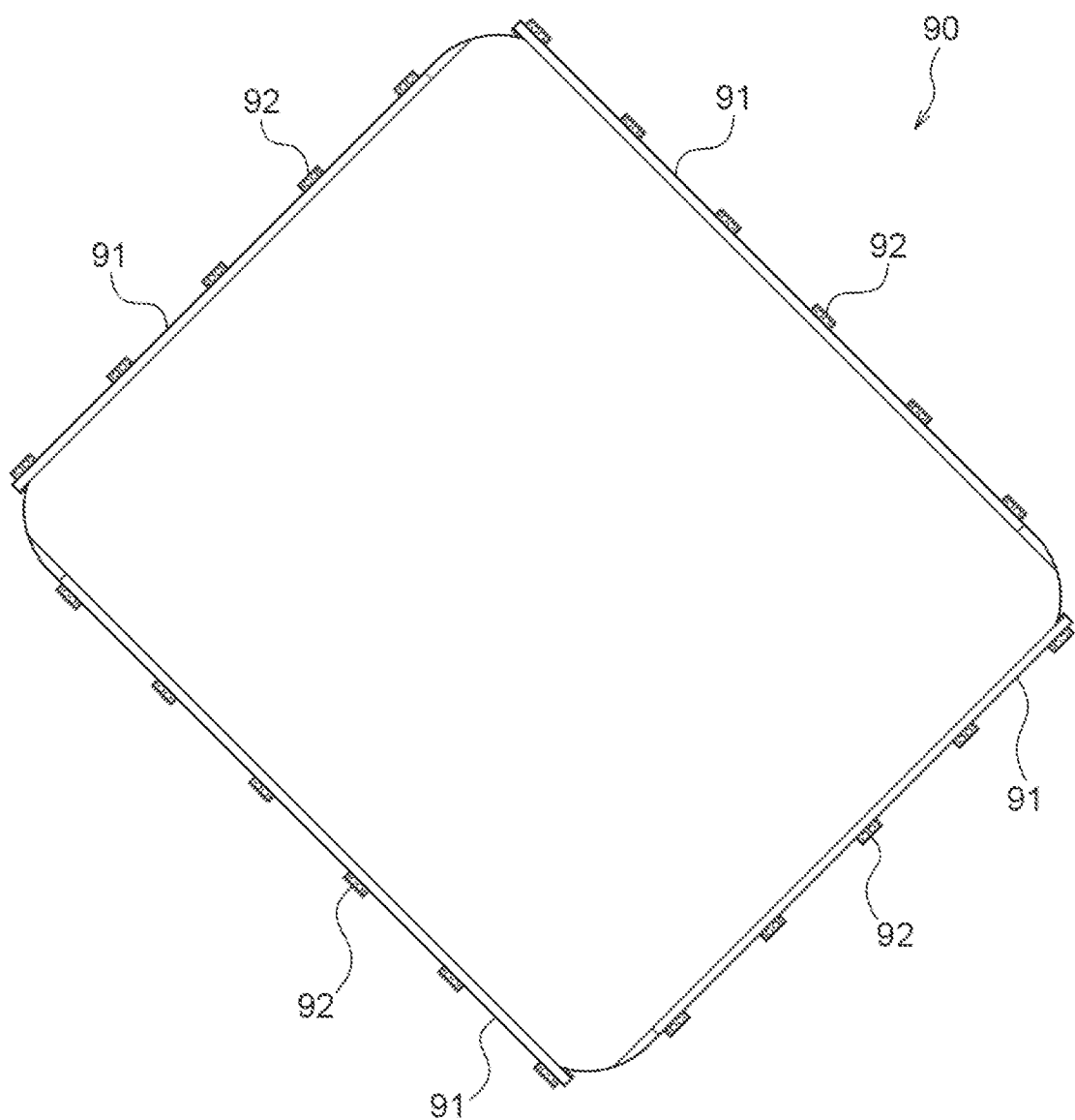
FIG. 15 is a rear view of the second holding member.
Figure 16:
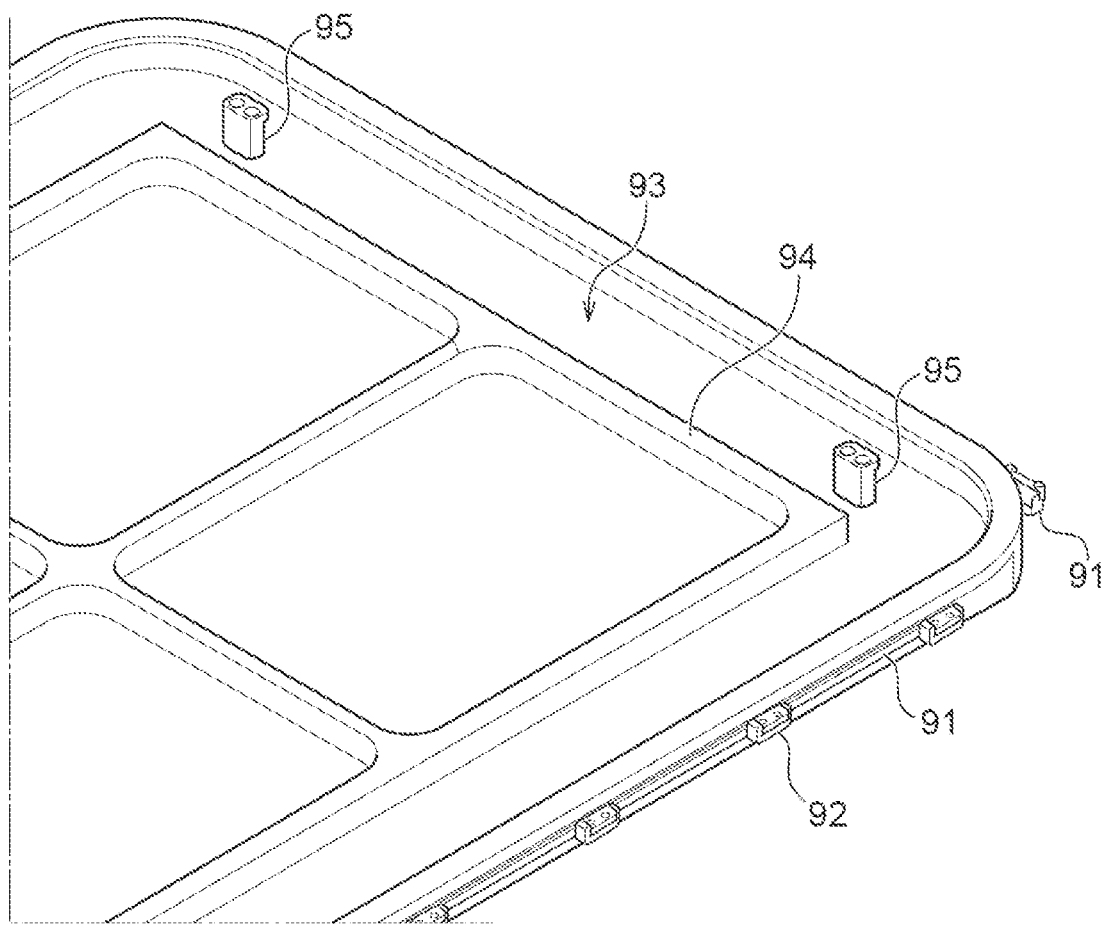
FIG. 16 is a front-side partially perspective view of the second holding member.

FIG. 14 is a front view of the second holding member 90. FIG. 15 is a rear view of the second holding member 90. FIG. 16 is a front-side partially perspective view of the second holding member 90. As shown in FIGS. 14 and 16, the second holding member 90 has a concave portion 93 for accommodating the substrate holding frame 80 on the front side. Furthermore, protruding portions 95 to be inserted in the holes 83 of the substrate holding frame 80 are provided in the concave portion 93. By inserting the protruding portion 95 of the second holding member 90 into the hole 83 of the substrate holding frame 80, the positional relationship between the second holding member 90 and the substrate holding frame 80 can be easily determined. Conversely, the second holding member 90 may be provided with a hole while the substrate holding frame 80 is provided with a protruding portion to be inserted in the hole. Even in this case, by inserting the protruding portion provided in the substrate holding frame 80 into the hole provided in the second holding member 90, the mutual positional relationship between the second holding member 90 and the substrate holding frame 80 can be easily determined. By assembling the first holding member 60 and the second holding member 90 under the state where the positional relationship between the second holding member 90 and the substrate holding frame 80 has been determined as described above, the position of the substrate holding frame 80 with respect to the first holding member 60, that is, the position of the substrate W1 can be easily determined. As a result, the power supply member 68 of the first holding member 60 can be easily brought into contact with a desired position on the substrate W1.

Furthermore, a convex portion 94 for supporting the substrate W1 from the rear side is provided in the concave portion 93. When the substrate W1 is a substrate which does not have any sufficient strength to maintain the shape of the printed circuit board or the like, the substrate W 1 may be bent due to the pressure of the processing liquid when the substrate holder 50 is immersed in the processing liquid. By supporting the substrate W1 from the rear side by the convex portion 94, it is possible to prevent the substrate W1 from bending even in such a case.

As described above, in the present embodiment, the substrate W1 is held by the substrate holding frame 80, and the substrate holding frame 80 is held by the first holding member 60 and the second holding member 90 so that the power supply member 68 is in contact with the held substrate W1. Therefore, since this substrate holder 50 is brought into contact with the power supply member 68 after holding the substrate W1, even in the case of a warped substrate W1 or a substrate W1 having low strength, the positioning of the substrate W1 to the power supply member 68 can be easily performed under a state where the substrate W1 is appropriately held and the shape thereof is maintained. Furthermore, in the substrate holder 50, the sealing between the first holding member 60 and the substrate W1 is performed after the substrate W1 is held. Therefore, even in the case of a warped substrate W1 or a substrate W1 having low strength, positioning of the substrate W1 to the first seal member 67 can be easily performed while the substrate W1 is appropriately held and the shape thereof is maintained.

Figure 17:
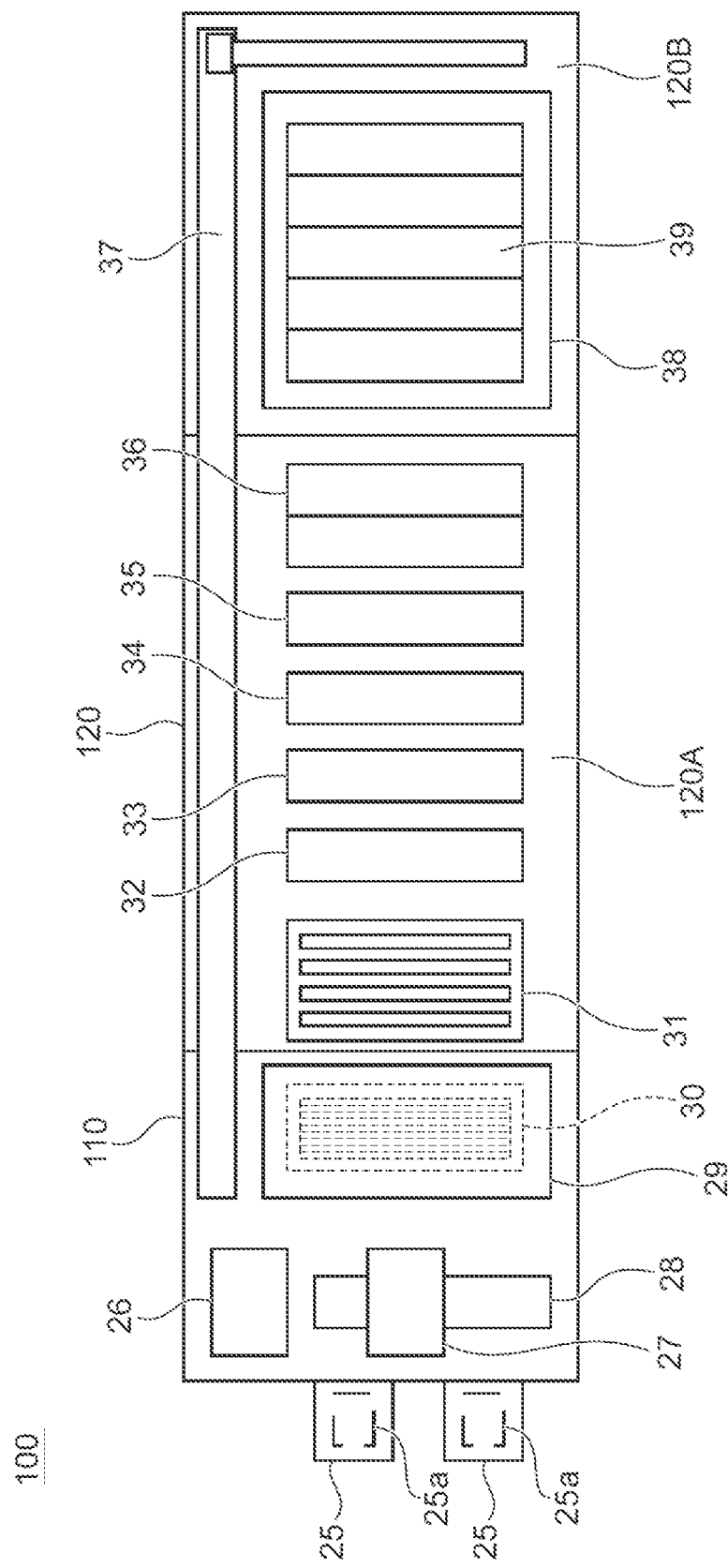
FIG. 17 is an overall arrangement diagram of a plating apparatus according to a first embodiment.

Next, a plating apparatus for performing plating processing using the substrate holder 50 described with reference to FIGS. 1 to 16 will be described. FIG. 17 is an overall arrangement diagram of the plating apparatus according to the first embodiment. As shown in FIG. 17, the plating apparatus 100 is roughly divided into a load/unload section 110 for loading the substrate W1 onto the substrate holder 50 or unloading the substrate W1 from the substrate holder 50, and a processing section 120 for processing the substrate W1. The processing section 120 further includes a pre-processing/post-processing section 120A for performing pre-processing and post-processing on the substrate W1, and a plating processing section 120B for performing plating processing on the substrate W1.

The load/unload section 110 includes two cassette tables 25, and a substrate cleaning device 26 for cleaning and drying the substrate W1 after the plating processing. A cassette 25a in which a substrate W1 such as a semiconductor wafer or a printed circuit board is accommodated is mounted on the cassette table 25. A substrate holding frame mounting/demounting mechanism 29 (corresponding to an example of a substrate holding body mounting/demounting section) for mounting and demounting the substrate holding frame 80 holding the substrate W1 to and from the first holding member 60 and the second holding member 90 is provided in the vicinity of the substrate cleaning device 26. A first stocker 30 for accommodating the substrate holding frame 80 is provided in the neighborhood of (for example, below) the substrate holding frame mounting/demounting mechanism 29. A substrate transporting device 27 including a transporting robot for transporting a substrate among the units 25, 26, 29 and 30 is arranged at the center of these units 25, 26, 29 and 30. The substrate transporting device 27 is configured to be capable of traveling by a traveling mechanism 28. The substrate cleaning device 26 may be provided to the plating apparatus 100 as in the case of the present embodiment or may be prepared as an independent device separately from the plating apparatus 100.

The pre-processing/post-processing section 120A includes a second stocker 31 for accommodating the first holding member 60 and the second holding member 90, a pre-wet bath 32, a pre-soak bath 33, a pre-rinse bath 34, a blow bath 35, and a rinse bath 36. The first holding member 60 and the second holding member 90 are stored and temporarily placed in the second stocker 31. The substrate W1 is immersed in pure water in the pre-wet bath 32. An oxide film on the surface of a conductive layer such as a seed layer formed on the surface of the substrate W1 is removed by etching in the pre-soak bath 33. The pre-soaked substrate W1 is cleaned together with the substrate holder 50 with cleaning liquid (pure water or the like) in the pre-rinse bath 34. Liquid draining of the cleaned substrate W1 is performed in the blow bath 35. The plated substrate W1 is cleaned together with the substrate holder 50 with the cleaning liquid in the rinse bath 36. The second stocker 31, the pre-wet bath 32, the pre-soak bath 33, the pre-rinse bath 34, the blow bath 35, and the rinse bath 36 are arranged in this order.

The plating processing section 120B includes plural plating baths 39 containing an overflow bath 38. Each plating bath 39 accommodates one substrate W1 therein and immerses the substrate W1 in plating solution stocked therein to perform plating such as copper plating on the surface of the substrate W1. Here, the type of the plating solution is not particularly limited, and various plating solutions are used depending on applications.

The plating apparatus 100 includes a substrate holder transporting device 37 adopting, for example, a linear motor system, which is located on the side of each of the above devices and transports the substrate holder 50 together with the substrate W1 among these devices. This substrate holder transporting device 37 is configured to transport the substrate holder 50 among the substrate holding frame mounting/demounting mechanism 29, the second stocker 31, the pre-wet bath 32, the pre-soak bath 33, the pre-rinse bath 34, the blow bath 35, the rinse bath 36, and the plating bath 39.

The plating apparatus shown in FIG. 17 includes the first stocker 30 for stocking the substrate holding frame 80, and the second stocker 31 for stocking the first holding member 60 and the second holding member 90. That is, since the first stocker 30 and the second stocker 31 are separate stockers, taking in and out of the substrate holding frame 80 into and from the first stocker 30 and taking in and out of the first holding member 60 and the second holding member 90 into and from the second stocker 31 can be performed simultaneously. Therefore, for example, the substrate holder transporting device 37 can move the first holding member 60 and the second holding member 90 from the second stocker 31 to the substrate holding frame mounting/demounting mechanism 29 at the same time when the substrate holding frame mounting/demounting mechanism 29 takes out the substrate holding frame 80 from the first stocker 30. Consequently, it is possible to reduce a transport waiting time of each of the substrate holding frame 80, the first holding member 60, and the second holding member 90, so that the throughput of the plating apparatus 100 can be enhanced. However, the present invention is not limited to this configuration, and the substrate holding frame 80, the first holding member 60, and the second holding member 90 may be stocked in a common stocker.

Figure 18A:
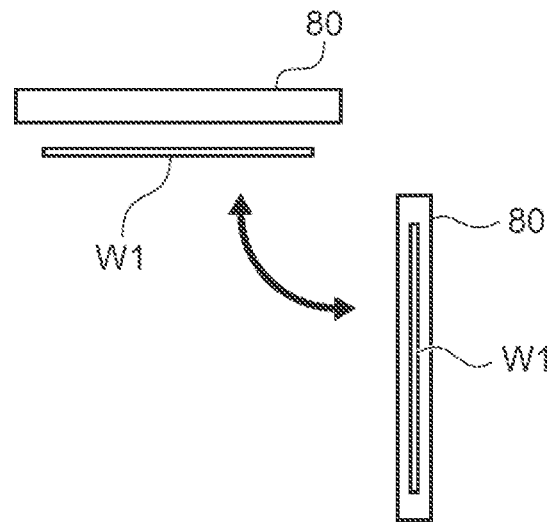
FIG. 18A is a schematic diagram showing a process of causing the substrate holder to hold a substrate.

Next, a process of causing the substrate holder 50 to hold the substrate W1 in the plating apparatus 100 shown in FIG. 17 will be described. FIGS. 18A to 18D are schematic diagrams showing the process of causing the substrate holder 50 to hold the substrate W1. As shown in FIG. 18A, the substrate holding frame mounting/demounting mechanism 29 first takes out the substrate holding frame 80 from the first stocker 30. The substrate transporting device 27 or the substrate holding frame mounting/demounting mechanism 29 which has received the substrate W1 from the substrate transporting device 27 transports the substrate W1 to the horizontally arranged substrate holding frame 80 with the plating target surface of the substrate W1 being set to face upwards. The substrate holding frame mounting/demounting mechanism 29 causes the substrate holding frame 80 to hold the substrate W1, and then arranges the substrate holding frame 80 vertically.

Figure 18B:
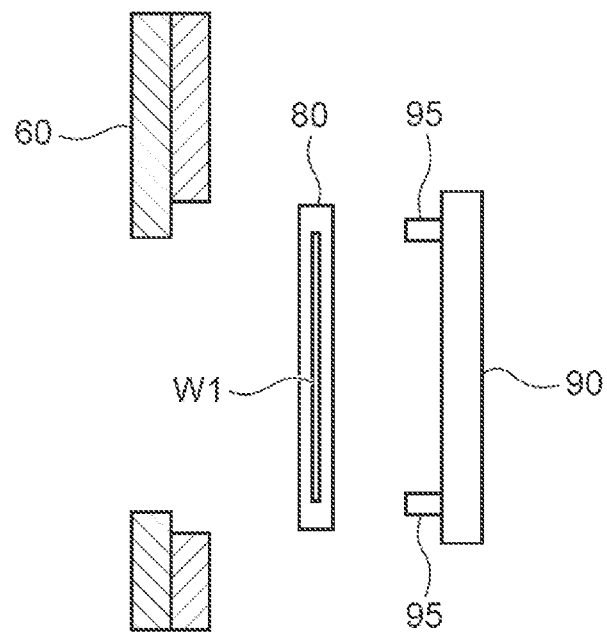
FIG. 18B is a schematic diagram showing the process of causing the substrate holder to hold the substrate.
Figure 18C:
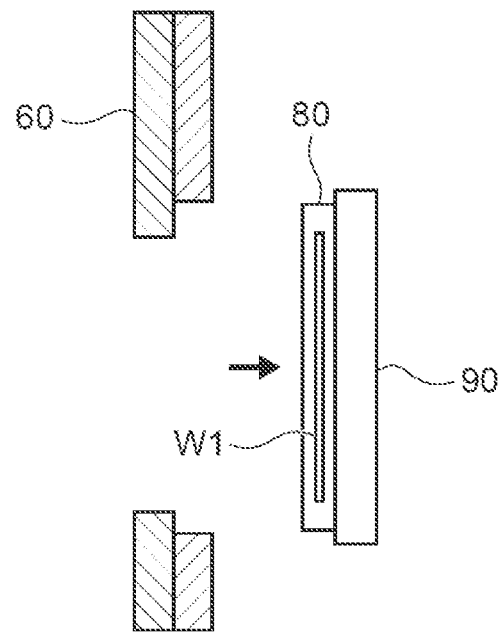
FIG. 18C is a schematic diagram showing the process of causing the substrate holder to hold the substrate.

Subsequently, the substrate holding frame mounting/demounting mechanism 29 receives the first holding member 60 and the second holding member 90 from the substrate holder transporting device 37, and positions the substrate holding frame 80 between the first holding member 60 and the second holding member 90 so that the plating target surface of the substrate W1 faces the first holding member 60 as shown in FIG. 18B. As shown in FIG. 18C, the substrate holding frame mounting/demounting mechanism 29 presses the substrate holding frame 80 against the second holding member 90, and inserts the protruding portions 95 of the second holding member 90 into the holes 83 of the substrate holding frame 80 (see from FIG. 6 to FIG. 9). As a result, the positional relationship between the substrate holding frame 80 and the second holding member 90 is determined, and the substrate holding frame 80 and the second holding member 90 can be handled as an integral part.

Figure 18D:
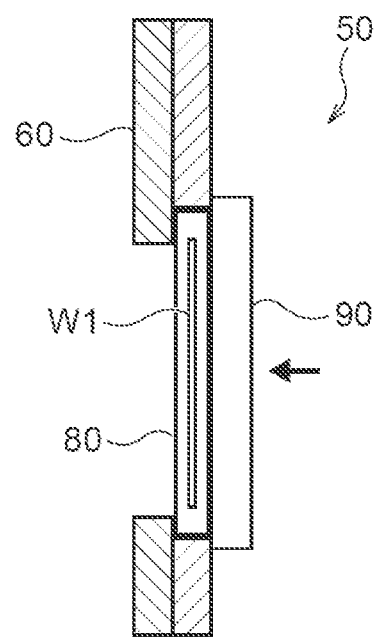
FIG. 18D is a schematic diagram showing the process of causing the substrate holder to hold the substrate.

Subsequently, as shown in FIG. 18D, the substrate holding frame mounting/demounting mechanism 29 presses the substrate holding frame 80 and the second holding member 90 against the first holding member 60. At this time, the substrate holding frame 80 is guided to a desired position by the guide members 69 (see FIG. 5) of the first holding member 60. As a result, the power supply member 68 of the first holding member 60 appropriately comes into contact with the plating target surface of the substrate W1 held by the substrate holding frame 80. At the same time, the gap between the first holding member 60 and the substrate W1 is sealed by the first seal member 67 (see FIG. 5), and the gap between the first holding member 60 and the second holding member 90 is sealed by the second seal member 70 (see FIG. 5).

When the substrate holding frame 80 is interposed and fixed between the first holding member 60 and the second holding member 90, the protrusion portions 92 of the second holding member 90 shown in FIG. 4 or the like are slid into the clampers 66 to fix the second holding member 90 to the first holding member 60. The substrate holder 50 assembled as described above is transported to the subsequent processing bath by the substrate holder transporting device 37.

Figure 19A:
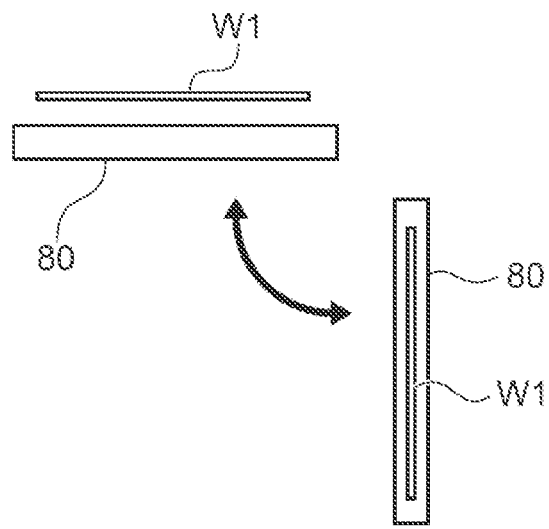
FIG. 19A is a schematic diagram showing another process of causing the substrate holder to hold a substrate.

FIGS. 19A to 19D are schematic diagrams showing another process of causing the substrate holder 50 to hold the substrate W1. This process is different from the process shown in FIGS. 18A to 18D in that the substrate W1 is transported to the horizontally arranged substrate holding frame 80 with the plating target surface of the substrate W1 being set to face downwards. That is, as shown in FIG. 19A, the substrate holding frame mounting/demounting mechanism 29 causes the substrate holding frame 80 to hold the substrate W1 with the plating target surface of the substrate W1 being set to face downward, and then the substrate holding frame 80 is arranged vertically.

Figure 19B:
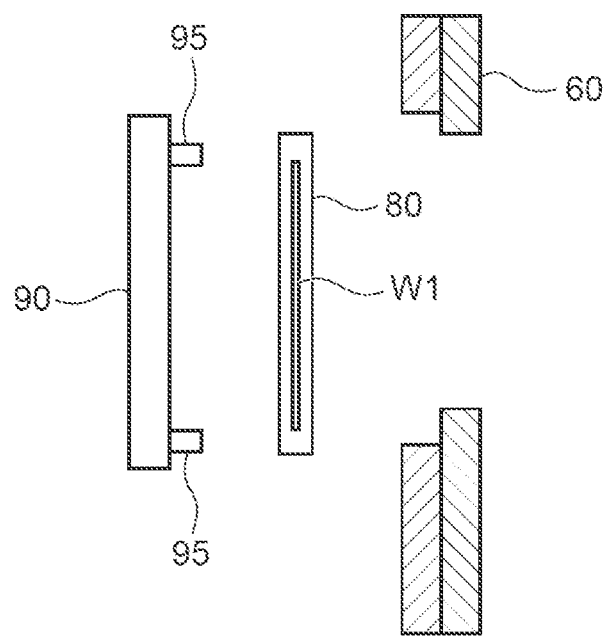
FIG. 19B is a schematic diagram showing the other process of causing the substrate holder to hold the substrate.
Figure 19C:
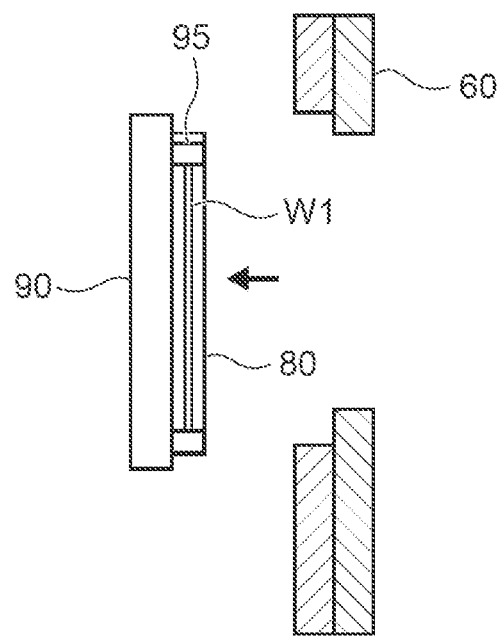
FIG. 19C is a schematic diagram showing the other process of causing the substrate holder to hold the substrate.

Subsequently, the substrate holding frame mounting/demounting mechanism 29 receives the first holding member 60 and the second holding member 90 from the substrate holder transporting device 37, and positions the substrate holding frame 80 between the first holding member 60 and the second holding member 90 so that the plating target surface of the substrate W1 faces the first holding member 60 as shown in FIG. 19B. As shown in FIG. 19C, the substrate holding frame mounting/demounting mechanism 29 presses the substrate holding frame 80 against the second holding member 90, and inserts the protruding portions 95 of the second holding member 90 into the holes 83 of the substrate holding frame 80 (see from FIGS. 6 to 9).

Figure 19D:
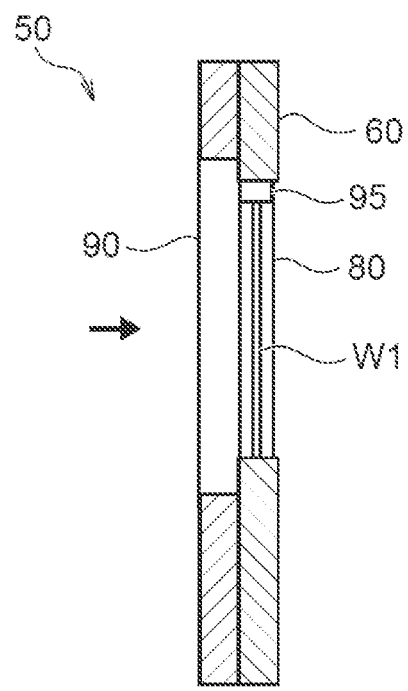
FIG. 19D is a schematic diagram showing the other process of causing the substrate holder to hold the substrate.

Subsequently, as shown in FIG. 19D, the substrate holding frame mounting/demounting mechanism 29 presses the substrate holding frame 80 and the second holding member 90 against the first holding member 60. As a result, the power supply member 68 of the first holding member 60 and the first seal member 67 (see FIG. 5) appropriately come into contact with the plating target surface of the substrate W1 held by the substrate holding frame 80. Furthermore, the gap between the first holding member 60 and the second holding member 90 is sealed by the second seal member 70 (see FIG. 5).

Figure 20A:
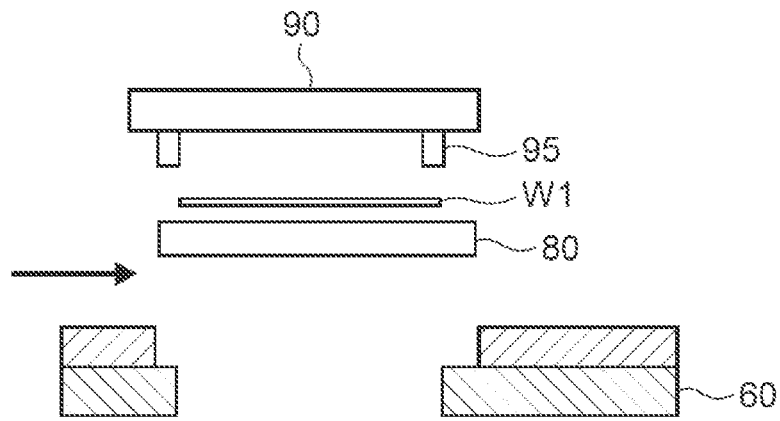
FIG. 20A is a schematic diagram showing another process of causing the substrate holder to hold a substrate.

FIGS. 20A to 20E are schematic diagrams showing another process of causing the substrate holder 50 to hold the substrate W1. This process is different from the process shown in FIGS. 19A to 19D in that the substrate holding frame 80 is held while the first holding member 60 and the second holding member 90 are horizontally arranged. As shown in FIG. 20A, the substrate holding frame mounting/demounting mechanism 29 first takes out the substrate holding frame 80 from the first stocker 30 and positions the substrate holding frame 80 between the first holding member 60 and the second holding member 90 which are horizontally arranged. The substrate transporting device 27 or the substrate holding frame mounting/demounting mechanism 29 that has received the substrate W1 from the substrate transporting device 27 transports the substrate W1 to the horizontally arranged substrate holding frame 80 with the plating target surface of the substrate W1 being set to face downwards.

Figure 20B:
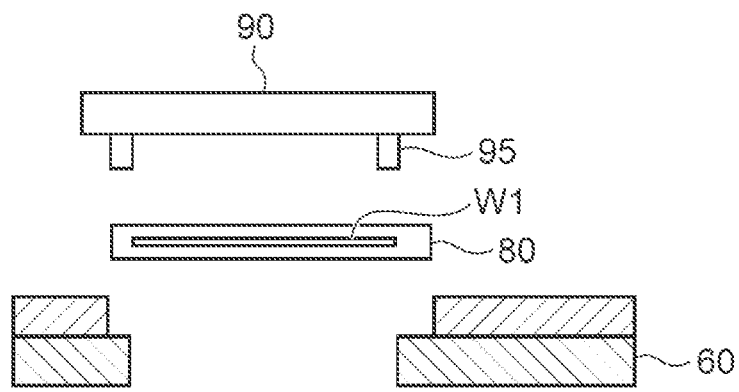
FIG. 20B is a schematic diagram showing the other process of causing the substrate holder to hold the substrate.
Figure 20C:
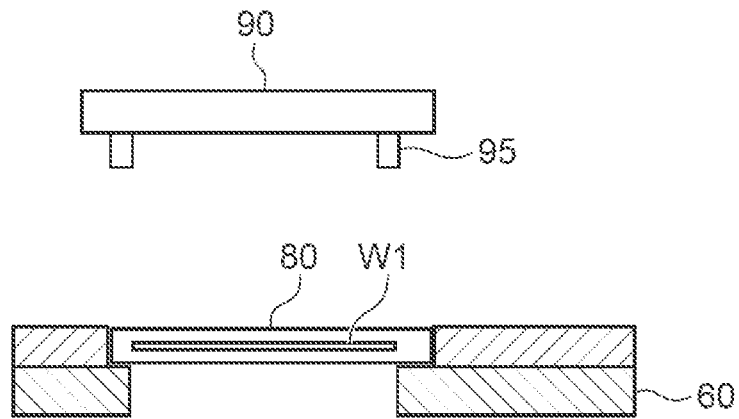
FIG. 20C is a schematic diagram showing the other process of causing the substrate holder to hold the substrate.

Subsequently, as shown in FIG. 20B, the substrate holding frame mounting/demounting mechanism 29 causes the substrate holding frame 80 to hold the substrate W1. As shown in FIG. 20C, the substrate holding frame mounting/demounting mechanism 29 presses the substrate holding frame 80 against the first holding member 60. At this time, the substrate holding frame 80 is guided to a desired position by the guide members 69 (see FIG. 5) of the first holding member 60. As a result, the power supply member 68 of the first holding member 60 appropriately comes into contact with the plating target surface of the substrate W1 held by the substrate holding frame 80.

Figure 20D:
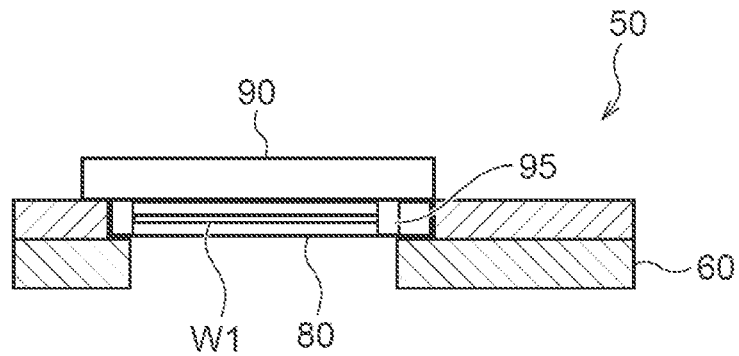
FIG. 20D is a schematic diagram showing the other process of causing the substrate holder to hold the substrate.

As shown in FIG. 20D, the substrate holding frame mounting/demounting mechanism 29 presses the second holding member 90 against the first holding member 60. At this time, the protruding portions 95 of the second holding member 90 are inserted into the holes 83 (see FIGS. 6 to 9) of the substrate holding frame 80, whereby the positional relationship between the substrate holding frame 80 and the second holding member 90 is determined. Furthermore, by pressing the second holding member 90 against the first holding member 60, the gap between the first holding member 60 and the substrate W1 is sealed by the first seal member 67 (see FIG. 5), and the gap between the first holding member 60 and the second holding member 90 is sealed by the second seal member 70 (see FIG. 5).

Figure 20E:
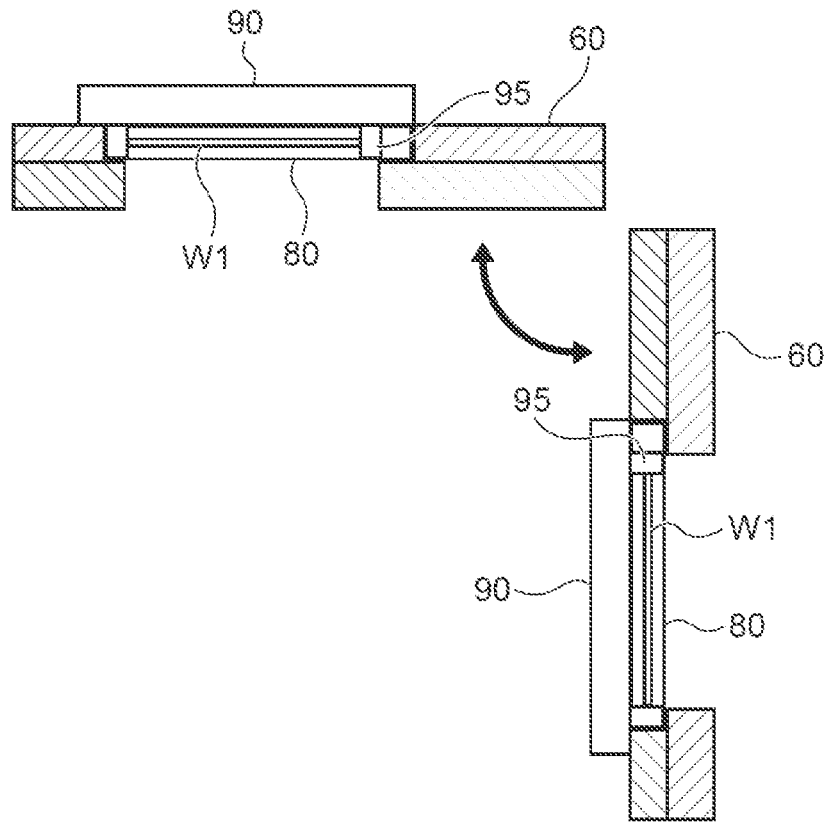
FIG. 20E is a schematic diagram showing the other process of causing the substrate holder to hold the substrate.

When the substrate holding frame 80 is interposed and fixed between the first holding member 60 and the second holding member 90, the protrusion portions 92 of the second holding member 90 shown in FIG. 4, etc. are slid into the clampers 66 to fix the second holding member 90 to the first holding member 60. As shown in FIG. 20E, the thus-assembled substrate holder 50 is vertically arranged by the substrate holding frame mounting/demounting mechanism 29. The vertically arranged substrate holder 50 is transported to the processing bath at the subsequent stage by the substrate holder transporting device 37.

Figure 21A:
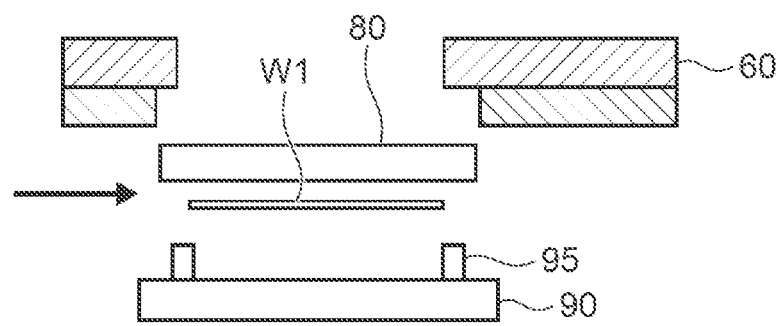
FIG. 21A is a schematic diagram showing another process of causing the substrate holder to hold a substrate.

FIGS. 21A to 21E are schematic diagrams showing another process of causing the substrate holder 50 to hold the substrate W1. This process is different from the process shown in FIGS. 20A to 20D in that the substrate W1 is transported to the horizontally arranged substrate holding frame 80 with the plating target surface of the substrate W1 being set to face upwards. That is, as shown in FIG. 21A, the substrate holding frame mounting/demounting mechanism 29 first takes out the substrate holding frame 80 from the first stocker 30, and positions the substrate holding frame 80 between the first holding member 60 and the second holding member 90 which are arranged horizontally. The substrate transporting device 27 or the substrate holding frame mounting/demounting mechanism 29 which has received the substrate W1 from the substrate transporting device 27 transports the substrate W1 to the horizontally arranged substrate holding frame 80 with the plating target surface of the substrate W1 being set to face upwards.

Figure 21B:
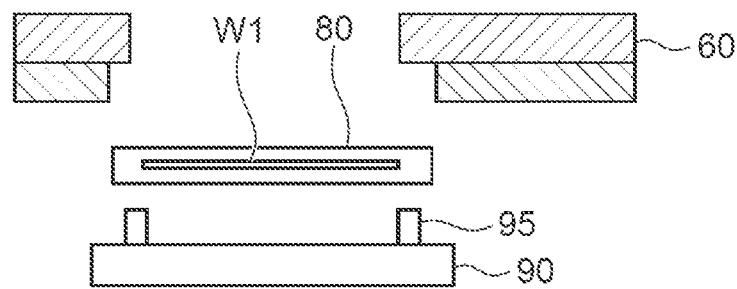
FIG. 21B is a schematic diagram showing the other process of causing the substrate holder to hold the substrate.
Figure 21C:
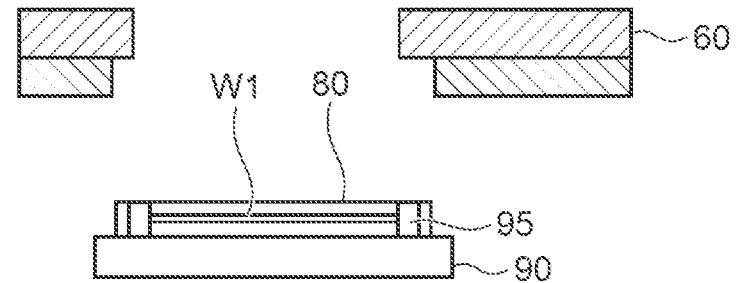
FIG. 21C is a schematic diagram showing the other process of causing the substrate holder to hold the substrate.

Subsequently, as shown in FIG. 21B, the substrate holding frame mounting/demounting mechanism 29 causes the substrate holding frame 80 to hold the substrate W1. As shown in FIG. 21C, the substrate holding frame mounting/demounting mechanism 29 presses the substrate holding frame 80 against the second holding member 90, and inserts the protruding portions 95 of the second holding member 90 into the holes 83 of the substrate holding frame 80 (see from FIG. 6 to FIG. 9). As a result, the positional relationship between the substrate holding frame 80 and the second holding member 90 is determined, and also the substrate holding frame 80 and the second holding member 90 can be handled as an integral part.

Figure 21D:
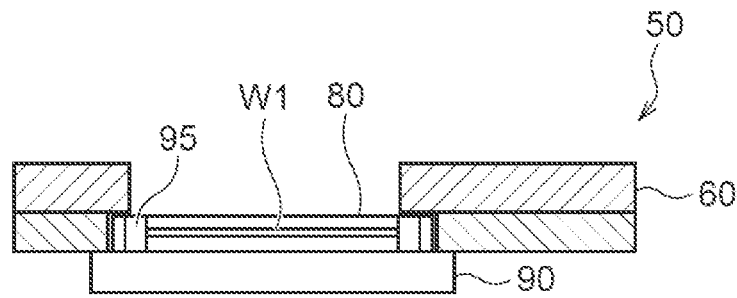
FIG. 21D is a schematic diagram showing the other process of causing the substrate holder to hold the substrate.

Subsequently, as shown in FIG. 21D, the substrate holding frame mounting/demounting mechanism 29 presses the substrate holding frame 80 and the second holding member 90 against the first holding member 60. When the substrate holding frame 80 is interposed and fixed between the first holding member 60 and the second holding member 90, the protrusion portions 92 of the second holding member 90 shown in FIG. 4, etc. are slid into the clampers 66 to fix the second holding member 90 to the first holding member 60.

Figure 21E:
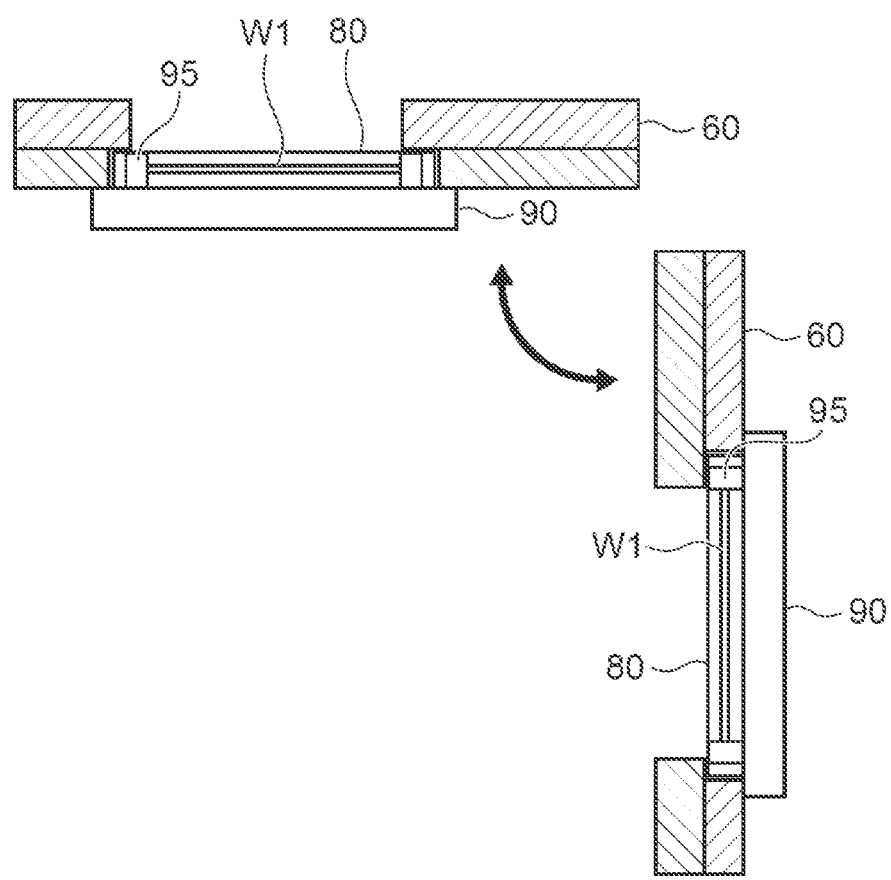
FIG. 21E is a schematic diagram showing the other process of causing the substrate holder to hold the substrate.

As shown in FIG. 21E, the thus-assembled substrate holder 50 is arranged vertically by the substrate holding frame mounting/demounting mechanism 29. The vertically arranged substrate holder 50 is transported to the processing bath at the subsequent stage by the substrate holder transporting device 37.

As described above, according to the plating apparatus shown in FIG. 17, the transportation of the substrate W1 to the substrate holding frame 80 and the mounting and demounting of the substrate holding frame 80 holding the substrate W1 to and from the first holding member 60 and the second holding member 90 can be performed. Furthermore, for example, the various processes as shown in FIGS. 18 to 21 can be adopted as the above mounting and demounting process.

Second Embodiment

Figure 22:
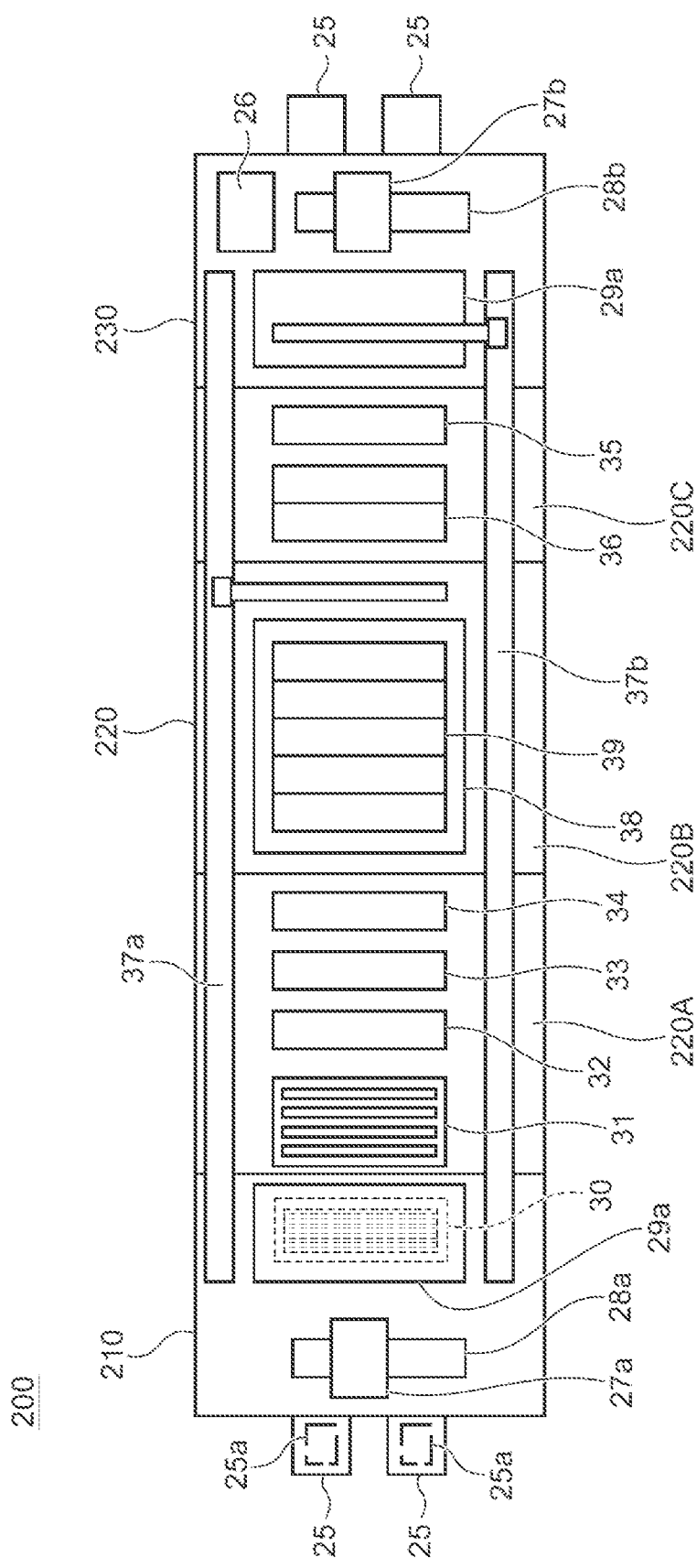
FIG. 22 is an overall arrangement diagram showing a plating apparatus according to a second embodiment.

Next, a plating apparatus according to a second embodiment will be described. FIG. 22 is an overall arrangement diagram of the plating apparatus according to the second embodiment. The plating apparatus of the second embodiment can use the same substrate holder 50 as in the first embodiment. As shown in FIG. 22, the plating apparatus 200 of the second embodiment is roughly divided into a load section 210 for loading the substrate W1 onto the substrate holder 50, a processing section 220 for processing the substrate W1, and an unload section 230 for unloading the substrate W1 from the substrate holder 50. The processing section 220 further includes a pre-processing section 220A for performing pre-processing on the substrate W1, a plating processing section 220B for performing plating processing on the substrate W1, and a post-processing section 220C for performing post-processing of the substrate W1.

In the load section 210 are arranged two cassette tables 25, a substrate holding frame mounting/demounting mechanism 29a (corresponding to an example of a substrate holding body mounting section), a first stocker 30, a substrate transporting device 27a, and a traveling mechanism 28a of the substrate transporting device 27a. The substrate holding frame mounting/demounting mechanism 29a of the load section 210 causes the substrate holding frame 80 to hold the first holding member 60 and the second holding member 90.

The pre-processing section 220A is arranged on a rear stage side of the load section 210. The pre-processing section 220A includes a second stocker 31, a pre-wet bath 32, a pre-soak bath 33, and a pre-rinse bath 34. The second stocker 31, the pre-wet bath 32, the pre-soak bath 33, and the pre-rinse bath 34 are arranged in this order.

The plating processing section 220B is arranged on a rear stage side of the pre-processing section 220A. The plating processing section 220B has plural plating baths 39 including an overflow bath 38. The post-processing section 220C is arranged on a rear stage side of the plating processing section 220B. The post-processing section 220C includes a rinse bath 36 and a blow bath 35. The rinse bath 36 and the blow bath 35 are arranged in this order toward the rear stage side.

The unload section 230 is arranged on a rear stage side of the post-processing section 220C. The unload section 230 includes two cassette tables 25, a substrate cleaning device 26, a substrate holding frame mounting/demounting mechanism 29b (corresponding to an example of a substrate holding body demounting portion), a substrate transporting device 27b, and a traveling mechanism 28b of the substrate transporting device 27b. The substrate holding frame mounting/demounting mechanism 29b of the load section 210 takes out the substrate holding frame 80 from the first holding member 60 and the second holding member 90.

The plating apparatus 200 includes substrate holder transporting devices 37a and 37b (corresponding to an example of a transporting machine) which are located on the side of each of these devices and transport the substrate holder 50 together with the substrate W1 among these devices. The substrate holder transporting devices 37a and 37b are configured to transport the substrate holder 50 among the substrate holding frame mounting/demounting mechanisms 29a and 29b, the second stocker 31, the pre-wet bath 32, the pre-soak bath 33, the pre-rinse bath 34, the blow bath 35, the rinse bath 36 and the plating baths 39. When two substrate holder transporting devices 37a and 37b are provided as shown in FIG. 22, only one substrate holder transporting device transports only the substrate holder 50 holding the pre-plating substrate W1, and the other substrate holder transporting device transports only the substrate holder 50 holding the post-plated substrate W1, thereby suppressing occurrence of a waiting time for delivery of the substrate holder 50. It is noted that only any one of the substrate holder transporting devices 37a and 37b may be provided to the plating apparatus 200. In this case, footprint of the plating apparatus can be reduced.

According to this plating apparatus 200, in the substrate holding frame mounting/demounting mechanism 29a, the substrate holding frame 80 is held by the first holding member 60 and the second holding member 90 to fabricate the substrate holder 50. Thereafter, the substrate holder 50 holding the substrate W1 is processed in the pre-processing section 220A, the plating processing section 220B, and the post-processing section 220C, and then transported to the unload section 230. In the unload section 230, the processed substrate W1 is taken out from the substrate holding frame 80 of the substrate holder 50, and is cleaned in the substrate cleaning device 26. The cleaned substrate W1 is accommodated in the cassette table 25 of the unload section 230 by the substrate transporting device 27b. When the substrate W1 is taken out from the substrate holder 50, the substrate holding frame 80, the first holding member 60 and the second holding member 90 are passed over each processing bath by the substrate holder transporting devices 37a and 37b, transported to the first stocker 30 and the second stocker 31 respectively, and stored therein.

As described above, the plating apparatus 200 according to the second embodiment includes the substrate holding frame mounting/demounting mechanism 29a for causing the first holding member 60 and the second holding member 90 to hold the substrate holding frame 80, and the substrate holding frame mounting/demounting mechanism 29b for taking out the substrate holding frame 80 from the first holding member 60 and the second holding member 90. Accordingly, the substrate holding frame mounting/demounting mechanism 29a causes the first holding member 60 and the second holding member 90 to hold the substrate holding frame 80, and at the same time the substrate holding frame mounting/demounting mechanism 29b can take out another substrate holding frame 80 to another first holding member 60 and another second holding member 90. As a result, the waiting time for mounting/demounting of the substrate holding frame 80 can be reduced, and the throughput of the plating apparatus 200 can be enhanced.

Furthermore, in the plating apparatus 200, the load section 210 and the unload section 230 are arranged so as to interpose the processing section 220 therebetween. In other words, the substrate holding frame mounting/demounting mechanism 29a and the substrate holding frame mounting/demounting mechanism 29b are arranged so as to interpose the processing section 220 therebetween. As a result, after the pre-processing, the plating processing and the post-processing are performed on the substrate W1, the substrate W1 can be taken out from the substrate holder 50 and accommodated in the cassette table 25 by the substrate holding frame mounting/demounting mechanism 29b without transporting the substrate W1 by a relatively long distance and returning the substrate W1 to the front stage side of the plating apparatus 200. Accordingly, the processed substrate W is not transported above the pre-processing bath, and thus the transport distance can be shortened, so that the transport time of the processed substrate W1 can be reduced. This makes it possible to prevent particles or the like from adhering to the surface of the substrate W1 during the transportation of the substrate W1.

Third Embodiment

Figure 23:
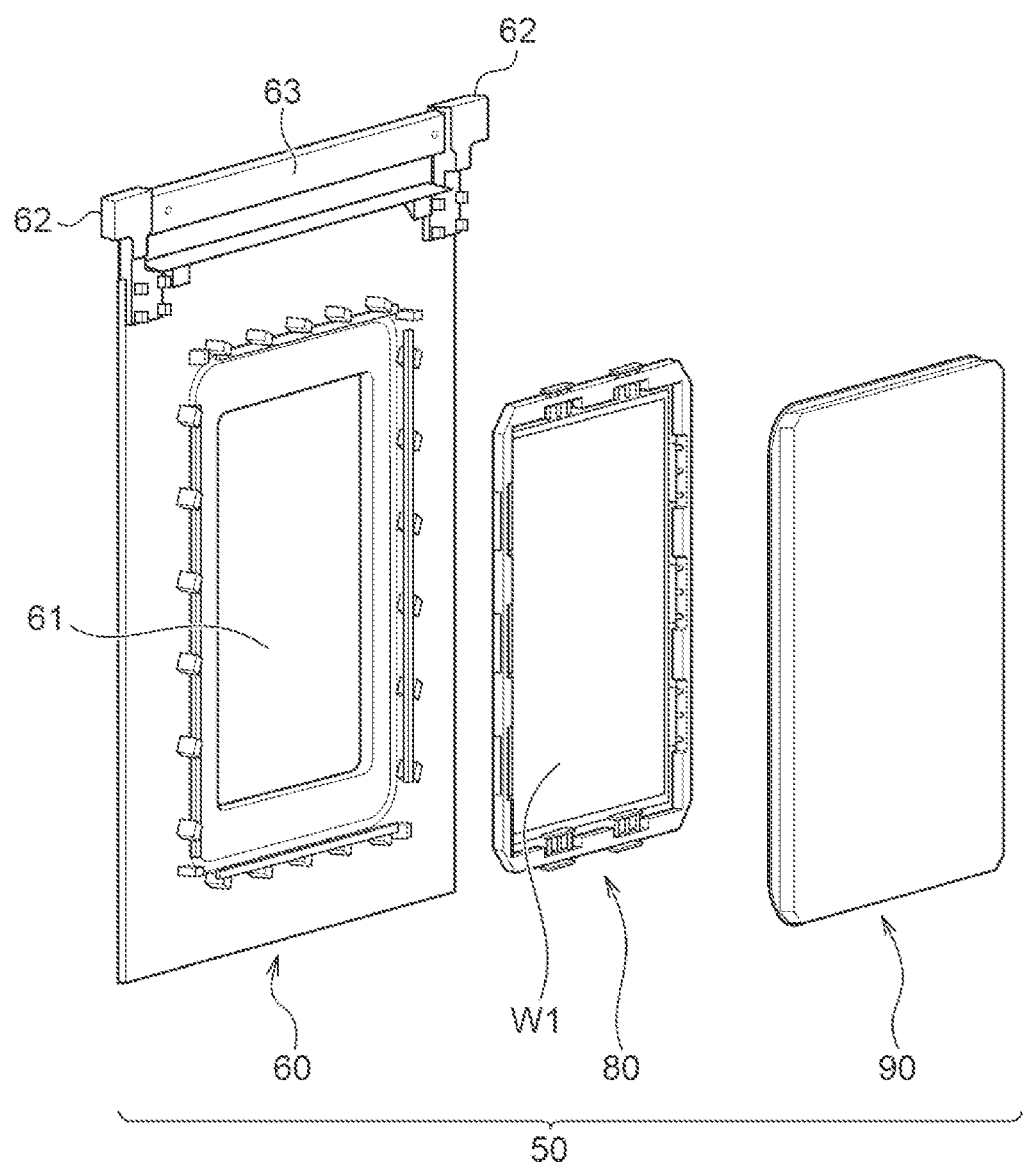
FIG. 23 is an exploded perspective view showing a substrate holder according to a third embodiment.

Next, a substrate holder according to a third embodiment will be described. FIG. 23 is an exploded perspective view showing a substrate holder 50 according to the third embodiment. As shown in FIG. 23, the substrate holder 50 according to the third embodiment is different from the substrate holder 50 shown in FIGS. 1 to 16 in the shape of the first holding member 60. Specifically, a polygonal opening portion 61 is formed in the substrate holder 50 according to the third embodiment so that a side of the polygonal opening portion 61 is positioned at a lower side in a vertical direction when the substrate holder 50 is suspended in the vertical direction. Therefore, the mounting angle of the substrate holding frame 80 and the second holding member 90 to the first holding member 60 is different from that of the first embodiment. Even such a substrate holder 50 can be used in the plating apparatuses 100 and 200 described with reference to the first embodiment and the second embodiment.

Fourth Embodiment

Next, a substrate holder according to a third embodiment will be described. FIG. 24 is an exploded perspective view showing the substrate holder 50 according to the fourth embodiment. FIG. 25 is a perspective view of the substrate holder 50 according to the fourth embodiment. As shown in FIGS. 24 and 25, in the substrate holder 50, the first holding member 60 does not have the suspension portion 62, the arm portion 63, and the external contact portion 64. Instead, the second holding member 90 has the suspension portion 62, the arm portion 63, and the external contact portion 64.

FIG. 26 is a cross-sectional view of the substrate holder 50 in an arrow view 24-24 shown in FIG. 25. As shown in FIG. 26, the second holding member 90 has a relay contact portion 96 which is electrically connected to the external contact portion 64. The relay contact portion 96 is configured to come into contact with the power supply member 68 of the first holding member 60 under a state where the substrate holder 50 is fabricated. As a result, current is supplied from an external power supply to the power supply member 68 via the external contact portion 64 and the relay contact portion 96, so that current can be made to flow through the plating target surface of the substrate W1. Even such a substrate holder 50 can be used in the plating apparatuses 100 and 200 described with reference to the first embodiment and the second embodiment.

Although the embodiments of the present invention have been described above, the embodiments of the invention described above aim to facilitate understanding of the present invention, and do not limit the present invention. The present invention can be modified and improved without departing from the subject matter of the invention, and it is needless to say that the present invention includes equivalents thereto. In addition, any combination or omission of respective components recited in claims and described in the specification are possible in a range in which at least some of the above-mentioned problems can be solved or a range in which at least a part of the effect is exhibited.

REFERENCE SIGNS LIST

W1 Substrate
27, 27a, 27b substrate transporting device
29, 29a, 29b substrate holding frame mounting/demounting mechanism
30 first stocker
31 second stocker
50 substrate holder
60 first holding member
61 opening portion
64 external contact portion
67 first seal member
68 power supply member
69 guide member
70 second seal member
80 substrate holding frame
81 substrate supporting body
82 fixing member
82a rod member
82b elastic body
82c slide member
83 hole
84 support surface
85 opening
90 second holding member
95 protruding portion
96 relay contact portion
100, 200 plating apparatus

The invention claimed is:

1. A substrate holder comprising:
a substrate holding body for pinching and holding a peripheral edge portion of a substrate; and
a first holding member and a second holding member that interpose and holds the substrate holding body therebetween, wherein
the first holding member includes an opening portion through which a plating target surface of the substrate is exposed, and a power supply member configured so as to be in contact with the plating target surface of the substrate,
the substrate holding body includes a substrate support body for supporting the peripheral edge portion of the substrate, and a fixing member for fixing the substrate supported by the substrate support body to the substrate support body, and
the fixing member is configured to contact a second surface opposite and parallel to the planting target surface.

2. The substrate holder according to claim 1, wherein the substrate support body has a support surface for supporting the peripheral edge portion of the substrate, and an opening through which the plating target surface of the substrate is exposed, and the fixing member has a fixing portion for fixing the peripheral edge portion of the substrate to the support surface, and a moving portion for moving the fixing portion along the support surface.

3. The substrate holder according to claim 1, wherein the first holding member has a guide member for guiding a position of the substrate holding body with respect to the first holding member.

4. The substrate holder according to claim 1, wherein the second holding member has a protruding portion on a surface thereof facing the substrate holding body, and the substrate holding body has a hole in which the protruding portion is inserted.

5. The substrate holder according to claim 1, wherein the first holding member has an external contact portion that is configured to be electrically connected to an external power supply, and the power supply member is electrically connected to the external contact portion.

6. The substrate holder according to claim 1, wherein the second holding member has an external contact portion configured to be electrically connected to an external power supply, and a relay contact portion that is configured to be electrically connected to the external contact portion and come into contact with the power supply member of the first holding member.

7. The substrate holder according to claim 1, wherein the substrate holding body is configured to be capable of holding a polygonal substrate.

8. The substrate holder according to claim 7, wherein the opening portion has a polygonal shape corresponding to the polygonal substrate, and is formed in the first holding member so that a corner portion thereof is located at a lower side in a vertical direction when the substrate holder is suspended in the vertical direction.

9. The substrate holder according to claim 1, further comprising a first seal member for sealing a gap between a plating target surface of the substrate held by the substrate holding body and the first holding member, and a second seal member for sealing a gap between the first holding member and the second holding member, wherein the power supply member is configured to be in contact with the plating target surface of the substrate in a sealed space formed by at least the first seal member and the second seal member.

10. A plating apparatus for performing plating processing using the substrate holder according to claim 1, comprising:
a substrate transporting device for transporting the substrate to the substrate holding body; and a substrate holding body mounting/demounting section for mounting/demounting the substrate holding body holding the substrate to/from the first holding member and the second holding member.

11. The plating apparatus according to claim 10, further comprising a first stocker for stocking the substrate holding body, and a second stocker for stocking the first holding member and the second holding member.

12. The plating apparatus according to claim 10, wherein the substrate holding body mounting/demounting section includes a substrate holding body mounting portion for causing the first holding member and the second holding member to hold the substrate holding body, and a substrate holding body demounting portion for demounting the substrate holding body from the first holding member and the second holding member.

* * * * *